US009209160B2

(12) United States Patent  (10) Patent No.: US 9,209,160 B2
Lee  (45) Date of Patent: Dec. 8, 2015

(54) SEMICONDUCTOR DEVICES COMPATIBLE WITH MONO-RANK AND MULTI-RANKS

(75) Inventor: Hoon Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 729 days.

(21) Appl. No.: 13/535,537

(22) Filed: Jun. 28, 2012

(65) Prior Publication Data

US 2013/0021866 A1  Jan. 24, 2013

(30) Foreign Application Priority Data

Jul. 20, 2011  (KR) .......................... 10-2011-0072076

(51) Int. Cl.
*G11C 8/00* (2006.01)
*H01L 25/065* (2006.01)
*G11C 5/02* (2006.01)
*G11C 7/10* (2006.01)
*G11C 7/20* (2006.01)
*G11C 8/18* (2006.01)
*H01L 23/00* (2006.01)
*H01L 25/18* (2006.01)

(52) U.S. Cl.
CPC ............ *H01L 25/0657* (2013.01); *G11C 5/02* (2013.01); *G11C 7/10* (2013.01); *G11C 7/20* (2013.01); *G11C 8/18* (2013.01); *H01L 24/13* (2013.01); *H01L 24/16* (2013.01); *H01L 24/48* (2013.01); *H01L 25/18* (2013.01); *H01L 2224/13025* (2013.01); *H01L 2224/16146* (2013.01); *H01L 2224/16225* (2013.01); *H01L 2224/16227* (2013.01); *H01L 2224/48145* (2013.01); *H01L 2225/06506* (2013.01); *H01L 2225/06513* (2013.01); *H01L 2225/06517* (2013.01); *H01L 2225/06531* (2013.01); *H01L 2225/06541* (2013.01); *H01L 2225/06565* (2013.01); *H01L 2225/06572* (2013.01); *H01L 2924/1434* (2013.01); *H01L 2924/1436* (2013.01); *H01L 2924/15311* (2013.01)

(58) Field of Classification Search
CPC ........ H01L 25/0657; G11C 5/02; G11C 7/10; G11C 8/18
USPC ....................................... 365/230.01, 230.06
See application file for complete search history.

(56) References Cited

U.S. PATENT DOCUMENTS

| 7,471,538 | B2 * | 12/2008 | Hofstra ........................... 365/51 |
| 7,702,874 | B2 * | 4/2010 | Vogt ............................... 711/170 |
| 7,796,446 | B2 * | 9/2010 | Ruckerbauer et al. ... 365/189.05 |
| 8,089,795 | B2 * | 1/2012 | Rajan et al. ....................... 365/63 |
| 8,438,328 | B2 * | 5/2013 | Smith et al. .................... 711/105 |
| 2007/0258278 | A1 * | 11/2007 | Bacha et al. ..................... 365/51 |
| 2008/0126690 | A1 * | 5/2008 | Rajan et al. .................... 711/105 |
| 2014/0192583 | A1 * | 7/2014 | Rajan et al. ...................... 365/63 |

FOREIGN PATENT DOCUMENTS

| JP | 2006-277870 | 10/2006 |
| JP | 2008-077779 | 4/2008 |
| KR | 1020100066849 A | 6/2010 |

\* cited by examiner

*Primary Examiner* — Viet Q Nguyen

(74) *Attorney, Agent, or Firm* — Myers Bigel Sibley & Sajovec, P.A.

(57) ABSTRACT

A provided memory device is compatible with a mono-rank or multi-ranks. A plurality of memory layers are stacked in the memory device. The memory device receives an address signal and chip select signals in response to a chip identification signal and a mode signal used to determine a mono-rank or multi-ranks. The plurality of memory layers operate as the mono-rank accessed by the address signal, or operate as the multi-ranks accessed by the chip select signals.

13 Claims, 32 Drawing Sheets

SEMICONDUCTOR DEVICES COMPATIBLE WITH MONO-RANK AND MULTI-RANKS

CROSS-REFERENCE TO RELATED APPLICATIONS

This application claims the benefit of Korean Patent Application No. 10-2011-0072076, filed on Jul. 20, 2011, in the Korean Intellectual Property Office, the disclosure of which is incorporated herein in its entirety by reference.

BACKGROUND

A semiconductor memory device, such as a DRAM, is widely used as a main memory of a computer, such as, for example, a server. Memory capacity and speed requirements by the main memory continue to increase to support high speed hardware and complex software. A variety of technologies have been developed to achieve a mass storage memory.

SUMMARY

The inventive concept provides a memory device in which a plurality of stacked memory layers selectively operate as a mono-rank or multi-ranks according to a mode signal, and a memory system including the memory device. A memory device according to some embodiments includes a first memory layer and a second memory layer stacked on the first memory layer. The first memory layer and second memory layer are configured to receive at least one address signal and/or at least one chip select signal are configured to selectively operate in either a mono-rank mode or in a dual-rank mode responsive to the at least one address signal and/or the at least one chip select signal.

In some embodiments, the first memory layer and the second memory layer are the same type of memory chips and each of the first memory layer and the second memory layer includes a core circuit unit in which a memory cell is formed and a peripheral circuit unit formed with respect to the memory cell.

Some embodiments provide that the first memory layer and the second memory layer are different types of memory chips and that each of the first memory layer and the second memory layer includes a core circuit unit in which a memory cell is formed and a peripheral circuit unit formed with respect to the memory cell. In some embodiments, the first memory layer further comprises a master circuit region that is configured to interface with at least one device that is external to the memory device.

Some embodiments provide that each of the first memory layer and the second memory layer includes a buffer unit that is configured to receive the at least one address signal and/or the at least one first chip select signal in response to a chip identification signal and a chip select address control unit that is configured to determine whether the respective one of the first memory layer and/or the second memory layer is selected according to the at least one address signal and/or the at least one chip select signal in response to the chip identification signal and a mode signal, and to generate at least one chip select address control signal used to determine the mono-rank mode or the dual-rank mode. In some embodiments, the at least one chip select signal comprises a first chip select signal and a second chip select signal and output signal lines of the buffer unit of the first memory layer that receive the at least one address signal, the first chip select signal, and the second chip select signal are electrically connected to signal lines of the at least one address signal, the first chip select signal, and the second chip select signal that are provided to the chip select address control unit of the second memory layer using through silicon vias (TSVs).

Some embodiments provide that the chip select address control unit includes a first logic unit that is configured to generate a first ME chip select address signal according to the first chip select signal, the second chip select signal, and the chip identification signal, a first buffer that is configured to transfer the first ME chip select address signal to a first node in response to a complementary signal of the mode signal, a second buffer that is configured to input a signal of the first node and generate a ME chip select row address control signal and a second logic unit that is configured to generate a first OTHER chip select address signal according to the first chip select signal, the address signal, and the chip identification signal. The chip select address control unit may further include a third buffer that is configured to transfer the first OTHER chip select address signal to a second node in response to the complementary signal of the mode signal, a fourth buffer that is configured to input a signal of the second node and to generate another chip select row address control signal, a third logic unit that is configured to generate a second ME chip select address signal according to the first chip select signal, the second chip select signal, and the chip identification signal, a fifth buffer that is configured to transfer the second ME chip select address signal to the first node in response to the mode signal, a fourth logic unit that is configured to generate a second OTHER chip select address signal according to the first chip select signal, the second chip select signal, and the chip identification signal, and a sixth buffer that is configured to transfer the second OTHER chip select address signal to the second node in response to the mode signal.

In some embodiments, the chip select address control unit further comprises a seventh buffer that is enabled when power is applied to the memory device and that is configured to transfer the second ME chip select address signal, an eighth buffer that is configured to generate an output of the seventh buffer as a ME chip select column address control signal, a ninth buffer that is enabled when power is applied to the memory device and that is configured to transfer the second OTHER chip select address signal, and a tenth buffer that is configured to generate an output of the ninth buffer as another chip select column address control signal.

Some embodiments provide that a plurality of memory layers are stacked on the second memory layer in such a way that the plurality of memory layers may be selected to operate in either of the mono-rank mode or in a multi-rank mode.

In some embodiments, the first memory layer and second memory layer are configured to receive at least one address signal and/or at least one chip select signal in response to a chip identification signal and a mode signal. In some embodiments, the mode signal is provided from a fuse box comprising a plurality of fuses in the first memory layer. Some embodiments provide that the mode signal is provided from a mode register.

In some embodiments, the memory device further comprises an interface layer that is configured to receive the at least one address signal or the at least one chip select signal in response to a chip identification signal, and to generate chip select control signals according to the address signal or the chip select signals received in response to the mode signal.

Some embodiments of the present invention include a memory device that includes a first data input/output unit that is configured to input and output data into and from a first memory layer in response to a first chip identification signal, a second data input/output unit that is configured to input and output the data into and from a second memory layer in response to a second chip identification signal, the second memory layer being stacked on the first memory layer, a first master data input/output unit that is connected to the first data input/output unit between a first group of data input/output pads, and a second master data input/output unit that is connected to the second data input/output unit between a second group of data input/output pads.

In some embodiments, the first data input/output unit, the first master data input/output unit, the second master data input/output unit are disposed in the first memory layer, and the second data input/output unit is disposed in the second memory layer. Some embodiments provide that the second data input/output unit and the second master data input/output unit are electrically connected to each other using a TSV. Some embodiments include an interface layer in which the first master data input/output unit and the second master data input/output unit are disposed. In some embodiments, the first data input/output unit is disposed in the first memory layer and the second data input/output unit is disposed in the second memory layer. Some embodiments provide that the first data input/output unit and the first master data input/output unit are electrically connected to each other using a first TSV, and the second data input/output unit and the second master data input/output unit are electrically connected to each other using a second TSV.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

DETAILED DESCRIPTION

Figure 1A:
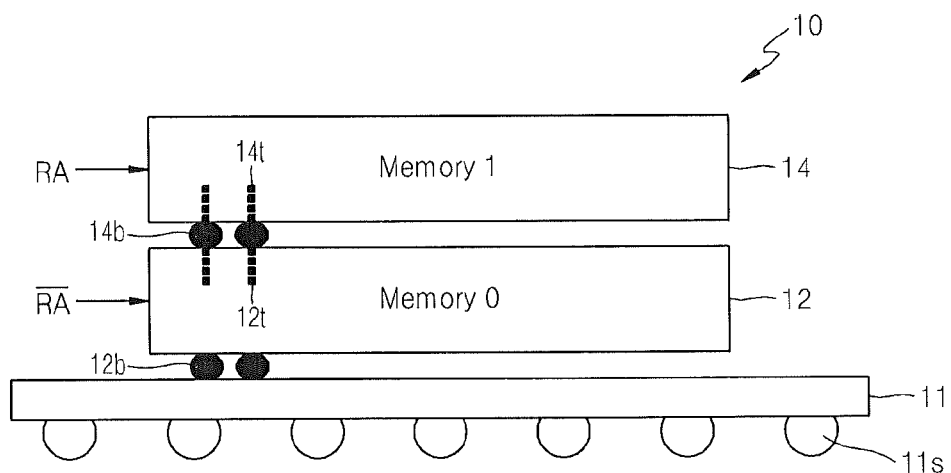
FIGS. 1A and 1B are cross-sectional views of a memory device compatible with a mono-rank or dual-ranks, according to some embodiments of the inventive concept.

The present inventive concept now will be described more fully hereinafter with reference to the accompanying drawings, in which embodiments of the inventive concept are shown. However, this inventive concept should not be construed as limited to the embodiments set forth herein. Rather, these embodiments are provided so that this disclosure will be thorough and complete, and will fully convey the scope of the inventive concept to those skilled in the art.

It will be understood that, although the terms first, second, etc, may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

It should be construed that foregoing general illustrations and following detailed descriptions are exemplified and an additional explanation of claimed inventive concepts is provided.

Reference numerals are indicated in detail in some embodiments of the present inventive concept, and their examples are represented in reference drawings. Throughout the drawings, like reference numerals are used for referring to the same or similar elements in the description and drawings.

One memory chip of a computer such as a server may be unable to satisfy a memory capacity required by a main memory. A dual inline memory module (DIMM) in which a plurality of memory chips is mounted on a module substrate may be used. If memory chips are disposed on the module substrate in a flat way, the number of memory chips to be mounted on the module substrate may be restricted, which may restrict the memory capacity. As such, methods of mounting a memory device in which a plurality of memory chips is stacked in a cubic and/or three-dimensional manner and packaged on the module substrate are described herein.

To describe a memory capacity of a memory device, a bank on a memory chip and a rank on a module construction may be introduced. The bank and rank may be described by using a DRAM chip as an example.

A memory core of the DRAM chip may include a plurality of memory banks. Banks may be defined as a set of accessible memory cells. Banks may be generally identified by addresses, in particular, bank addresses.

On a memory module including one or more DRAM chips, ranks may be defined as a set of DRAM chips that correspond to a commonly received command and address which may be received simultaneously by each of the one or more DRAM chip that are associated with that rank. In general, ranks are identified by using a chip select signal (CS) provided to the memory module.

Memory chips mounted on the memory module may employ a cubic structure (3D) arrangement technology of stacking memory chips in response to a request for a high integration and high capacity memory. The 3D arrangement method of memory chips may provide a conventional division of one memory chip into a plurality of memory chips. Stacking memory chips may realize a high capacity memory.

Each of memory chips stacked in a DRAM chip may be a general DRAM chip having the same construction and capable of independent read and write operations. A memory controller for driving the DRAM chip may selectively access the memory chips by using a chip select signal corresponding to each of memory chips stacked in the DRAM chip. In this case, the memory chips stacked in the DRAM chip may operate as multi-ranks.

In some embodiments, the memory controller may recognize the memory chips stacked in the DRAM chip as one memory chip and selectively access the memory chips. In this case, the memory chips stacked in the DRAM chip operates as a mono-rank in which the memory chips are selected by using one chip select signal.

According to a selective request of the memory controller, a memory device in which the memory chips stacked in the DRAM chip that are compatible with the mono-rank or the multi-ranks is provided.

Figure 1B:
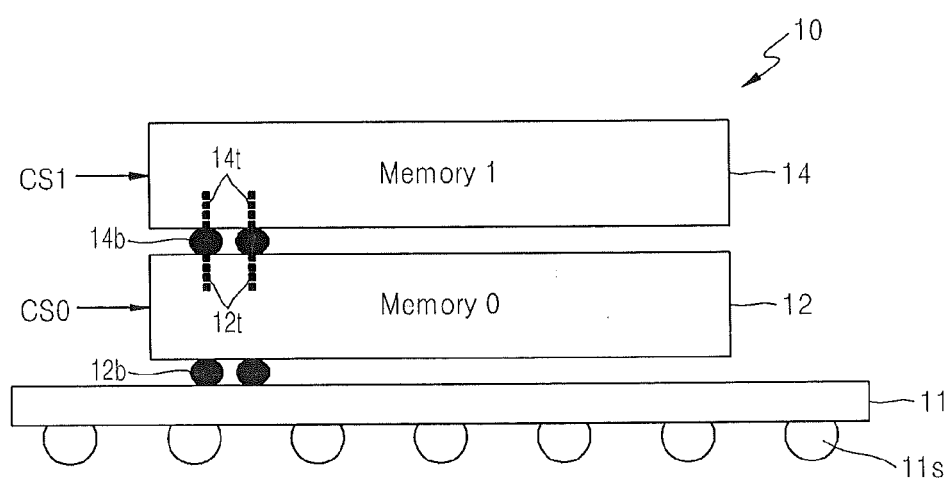

FIGS. 1A and 1B are cross-sectional views of a memory device 10 compatible with a mono-rank or dual-ranks, according to some embodiments of the inventive concept.

Referring to FIGS. 1A and 1B, the memory device 10 is packaged by stacking a first memory chip 12 and a second memory chip 14 on a printed circuit board (PCB) 11. Solder balls 11s that are external terminals are disposed in a rear surface of the PCB 11. The solder balls 11s are connected to address signals RA, CA, chip select signals CS0, CS1, a clock signal CK, a clock enable signal CKE, a row address strobe signal RAS, a column address strobe signal CAS, a write enable signal WE, a power voltage VDD, and/or a ground signal VSS, among others. These command and address signals may be provided from a memory controller, and may be electrically connected to the first memory chip 12 by using bumps 12b.

Although the memory device 10 includes the two memory chips 12 and 14 stacked in one semiconductor package, the inventive concept is not limited thereto, and two or more memory chips may be stacked.

The first memory chip 12 and the second memory chip 14 may include a core circuit unit in which memory cells are formed and a peripheral circuit unit in which peripheral circuits are formed with respect to memory cells.

The first memory chip 12 stacked below the second memory chip 14 may further include a circuit region (hereinafter referred to as a "master circuit region") for interfacing the memory device 10 with the outside. The core circuit unit and the peripheral circuit unit included in the first memory chip 12 perform read/write operations to interface with the master circuit region. The first memory chip 12 including the master circuit region may be a master chip.

The second memory chip 14 stacked above the first memory chip 12 may be electrically connected to the master circuit region of the first memory chip 12, and the core circuit unit and the peripheral circuit unit included therein perform read/write operations. The second memory chip 14 connected to the first memory chip 12 that is the master chip may be called a slave chip.

The memory device 10 has a stack structure in which the first memory chip 12 and the second memory chip 14 are electrically connected to each other by using through silicon vias (TSVs) 12t and 14t and micro bumps 14b. Although the memory device 10 has the stack structure in which the first memory chip 12 and the second memory chip 14 are electrically connected to each other by using TSVs 12t and 14t and the micro bumps 14b in the present embodiment, the inventive concept is not limited thereto, and the memory device 10 may have a stack structure in which the first memory chip 12 and the second memory chip 14 are electrically connected to each other by using a wire bonding, interposer, and/or a tape including wires, among others.

Further, the first memory chip 12 and the second memory chip 14 may be electrically connected to each other by using a radiative method that uses a radio frequency (RF) and/or ultrasound, an inductive coupling method that uses magnetic induction, and/or a non-radiative method that uses magnetic field resonance.

The radiative method transmits a signal wirelessly by using an antenna such as a monopole or a planar inverted-F antenna (PIFA). Power radiates while time varying electric fields and/or magnetic fields interface with each other. If two antennas have the same frequency, the signal can be received according to the polarization properties of an incident wave.

The inductive coupling method uses a number of coils such that a magnetic field may be strongly induced in one direction, and when coils which resonate at a similar frequency become very close to each other, inductive coupling takes place.

The non-radiative method uses evanescent wave coupling that moves electronic waves between two media which resonate at the same frequency through a near distance electronic field.

In FIG. 1A, the memory device 10 operates as a mono-rank in which the first memory chip 12 and the second memory chip 14 are selected by one chip select signal (not shown). The first memory chip 12 and the second memory chip 14 may be selectively accessed by address signals /RA, RA. The address signal /RA is complementary to the address signal RA. The first memory chip 12 is accessed by the address signal /RA. The second memory chip 14 is accessed by the address signal RA. For example, if each of the first memory chip 12 and the second memory chip 14 has 4 G bit memory capacity, the memory device 10 operates like one memory chip having 8 G bit memory capacity.

In FIG. 1B, the memory device 10 operates as a dual-rank in which the first memory chip 12 and the second memory chip 14 are selected by the two chip select signals CS0 and CS1. The first memory chip 12 and the second memory chip 14 are selectively accessed by the chip select signals CS0 and CS1. The first memory chip 12 is accessed by the chip select signal CS0. The second memory chip 14 is accessed by the chip select signal CS1. For example, if each of the first memory chip 12 and the second memory chip 14 has 4 G bit memory capacity, the memory device 10 operates like two memory chips having 4 G bit memory capacity.

Figure 2:
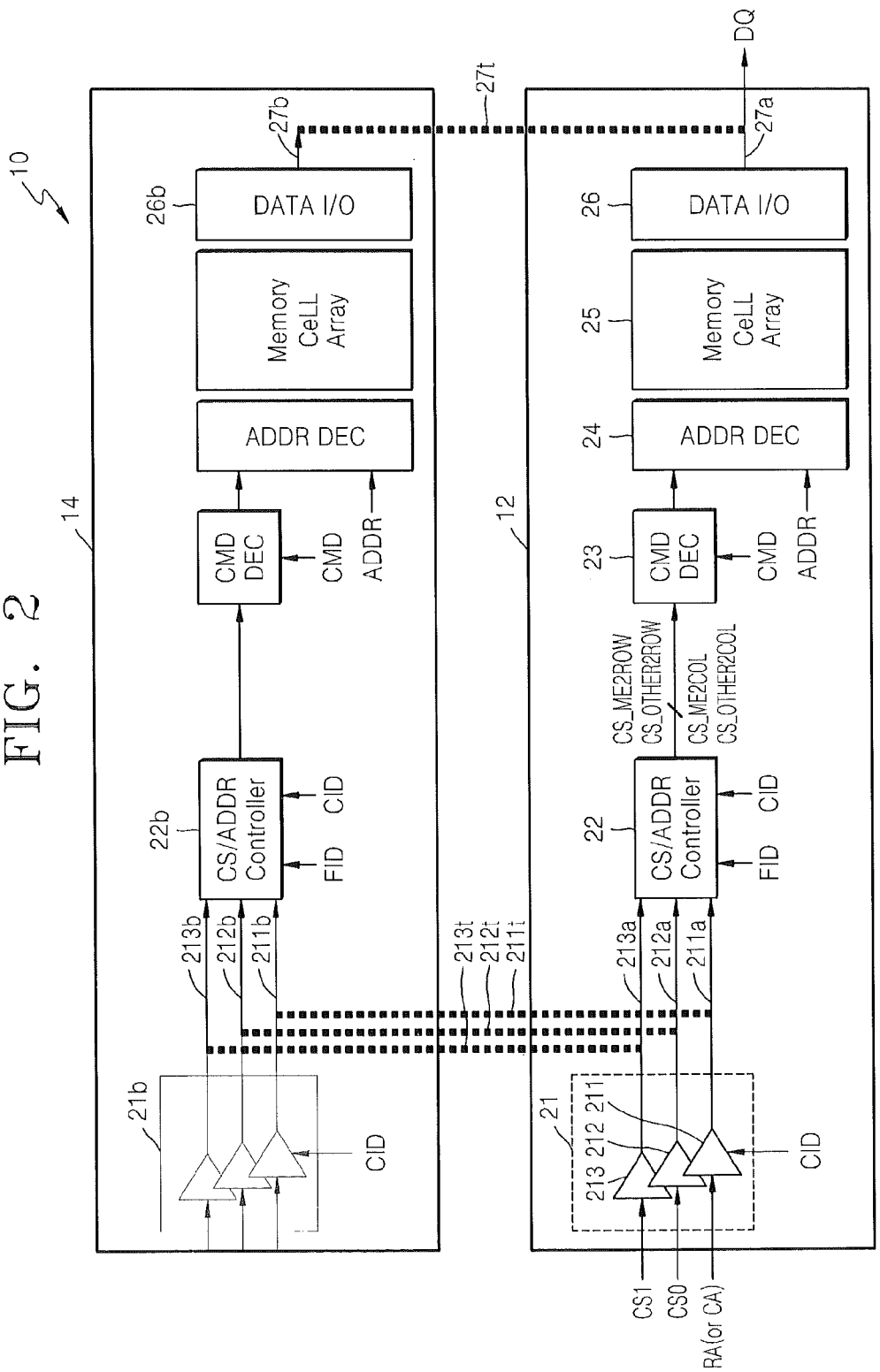
FIG. 2 is a block diagram of a memory device compatible with a mono-rank or dual-ranks, according to some embodiments of the inventive concept.

FIG. 2 is a block diagram of the memory device 10 compatible with a mono-rank or dual-ranks, according to some embodiments of the inventive concept.

Referring to FIG. 2, the memory device 10 includes the first memory chip 12 and the second memory chip 14 stacked in a package. The first memory chip 12 and the second memory chip 14 are stacked in one package, and thus, for descriptive convenience, the first memory chip 12 and the second memory chip 14 are referred to as a first memory layer and a second memory layer, respectively.

The first memory layer 12 includes a buffer unit 21, a chip select address control unit 22, a command decoder 23, an address decoder 24, a memory cell array 25, and a data input/output unit 26. The memory cell array 25 may be configured as a core circuit unit including a memory cell. The buffer unit 21, the chip select address control unit 22, the command decoder 23, the address decoder 24, and the data input/output unit 26 may be configured as a peripheral circuit unit with respect to the memory cell array 25. The second memory layer 14 may be configured in the same manner as the first memory layer 12. To avoid redundant descriptions, the elements of the first memory layer 12 are specifically described.

The buffer unit 21 of the first memory layer 12 receives the address signal RA, the first chip select signal CS0, and the second chip select signal CS1 in response to a chip identification signal CID. The chip identification signal CID identifies the first memory layer 12. The chip identification signal CID is provided by a fuse box (not shown) disposed in the first memory layer 12. The fuse box includes a plurality of fuses. The chip identification signal CID is set by combinations of the selectively cut fuses included in the fuse box.

The address signal RA, the first chip select signal CS0, and the second chip select signal CS1 may be provided by a memory controller. The address signal RA may be a row address signal that addresses word lines of the memory cell array 25. In particular, the address signal RA may be set as a most significant bit (MSB) among address signals that address a plurality of banks A_BANK, B_BANK, C_BANK, D_BANK, E_BANK, F_BANK, G_BANK, and H_BANK of the memory cell array 25. The memory controller may provide the column address signal CA instead of the row address signal RA. The column address signal CA addresses bit lines of the memory cell array 25. The first chip select signal CS0 may be set to select the first memory layer 12. The second chip select signal CS1 may be set to select the second memory layer 14.

The buffer unit 21 includes a first buffer 211 that receives the address signal RA, a second buffer 212 that receives the first chip select signal CS0, and a third buffer 213 that receives the second chip select signal CS1 in response to the chip select signal CID. The address signal RA, the first chip select signal CS0, and the second chip select signal CS1 that are received by the buffer unit 21 are transmitted to the chip select address control unit 22.

The chip select address control unit 22 determines whether chips corresponding to the chip select address control unit 22 or other chips are selected in response to the chip select signal CID, and determines a mono-rank mode or a dual-rank (multi-ranks) mode in response to a mode signal FID. The mode signal FID may be provided by a fuse box (not shown) disposed in the first memory layer 12. The fuse box includes a plurality of fuses. The mode signal FID is set by combinations of the selectively cut fuses included in the fuse box. The mode signal FID may be also set according to bit information stored in a mode register MRS.

The chip select address control unit 22 generates chip select address control signals CS_ME2ROW, CS_ME2COL, CS_OTHER2ROW, and CS_OTHER2COL according to the address signal RA, the first chip select signal CS0, and the second chip select signal CS1 that are transmitted to the buffer unit 21 in response to the chip select signal CID and the mode signal FID. The chip select address control unit 22 generates the ME chip select row address control signal CS_ME2ROW, the OTHER chip select row address control signal CS_ME2COL, the ME chip select column address control signal CS_OTHER2ROW, and the OTHER chip select column address control signal CS_OTHER2COL.

The command decoder 23 generates command control signals according to the chip select address control signals CS_ME2ROW, CS_ME2COL, CS_OTHER2ROW, and CS_OTHER2COL output from the chip select address control unit 22 and a command signal CMD. The command decoder 23 may include a row command decoder and a column command decoder. The command control signals are transmitted to the address decoder 24.

The address decoder 24 includes a row decoder and a column decoder that address memory cells, and activates word lines and bit lines that select memory cells in response to the command control signals and an address signal ADDR.

The memory cell array 25 may include the banks A_BANK, B_BANK, C_BANK, D_BANK, E_BANK, F_BANK, G_BANK, and H_BANK.

The data input/output unit 26 drives write data and read data to and from the memory cell array 25. The write data is sequentially input into a data input/output pad DQ, is transferred to an input buffer and a flipflop of the data input/output unit 26, and is converted into parallel data by a serial-to-parallel conversion unit. The parallel data is transferred to a data input/output driving unit/sense amplification unit through a write data alignment unit that adjusts the parallel data to be aligned in a line in the memory cell array 25. Data is read from the memory cell array 25, is output as parallel read data through the data input/output driving unit/sense amplification unit, is adjusted by a read data alignment unit or a read first-in/first-out (FiFo) unit, is converted into serial data through a parallel-to-serial conversion unit, and is sequentially output to the data input/output pad DQ through an output buffer.

The buffer unit 21, the chip select address control unit 22, the command decoder 23, the address decoder 24, the memory cell array 25, and the data input/output unit 26 included in the first memory layer 12 may be configured and operate in the second memory layer 24 in the same manner, except that a buffer unit 21*b* of the second memory layer 14 is disabled in response to the chip identification signal CID.

The buffer unit 21 of the first memory layer 12 receives the address signal RA, the first select signal CS0, and the second chip select signal CS1 through the first through third buffers 211, 212, and 213 that are enabled in response to the chip select signal CID. The first through third buffers 211, 212, and 213 transfer the address signal RA, the first select signal CS0, and the second chip select signal CS1 to output signal lines 211*a*, 212*a*, and 213*a*.

The output signal lines 211*a*, 212*a*, and 213*a* of the buffer unit 21 of the first memory layer 12 may be electrically connected to the second memory layer 14 by using TSVs 211*t*, 212*t*, and 213*t*. The output signal line 211*a* of the buffer unit 21 that receives the address signal RA is electrically connected to a signal line 211*b* of the second memory layer 14 by using the TSV 211*t*. The signal line 211*b* of the second memory layer 14 is an address signal RA line provided to a chip select address control unit 22*b* of the second memory layer 14. That is, the address signal RA input through the first buffer 211 of the first memory layer 12 is provided to the chip select address control unit 22*b* of the second memory layer 14 by using the TSV 211*t*.

The output signal line 212*a* of the second buffer 212 that receives the first chip select signal CS0 is electrically connected to a signal line 212*b* of the second memory layer 14. The signal line 212*b* of the second memory layer 14 is the first chip select signal CS0 provided to the chip select address control unit 22*b* of the second memory layer 14. That is, the first chip select signal CS0 input through the second buffer 212 of the first memory layer 12 is provided to the chip select address control unit 22*b* of the second memory layer 14 by using the TSV 212*t*.

The output signal line 213*a* of the third buffer 213 that receives the second chip select signal CS1 is electrically connected to a signal line 213*b* of the second memory layer 14. The signal line 213*b* of the second memory layer 14 is the second chip select signal CS1 provided to the chip select address control unit 22*b* of the second memory layer 14. That is, the second chip select signal CS1 input through the third buffer 213 of the first memory layer 12 is provided to the chip select address control unit 22*b* of the second memory layer 14 by using the TSV 213*t*.

The data input/output unit 26 of the first memory layer 12 drives write data and read data to and from the memory cell array 25. Likewise, a data input/output unit 26*b* of the second memory layer 14 drives write data and read data to and from a memory cell array of the second memory layer 14. A data input/output line 27*a* connected to the data input/output unit 26 of the first memory layer 12 is electrically connected to a data input/output line 27*b* connected to the data input/output unit 26*b* of the second memory layer 14.

Figure 3:
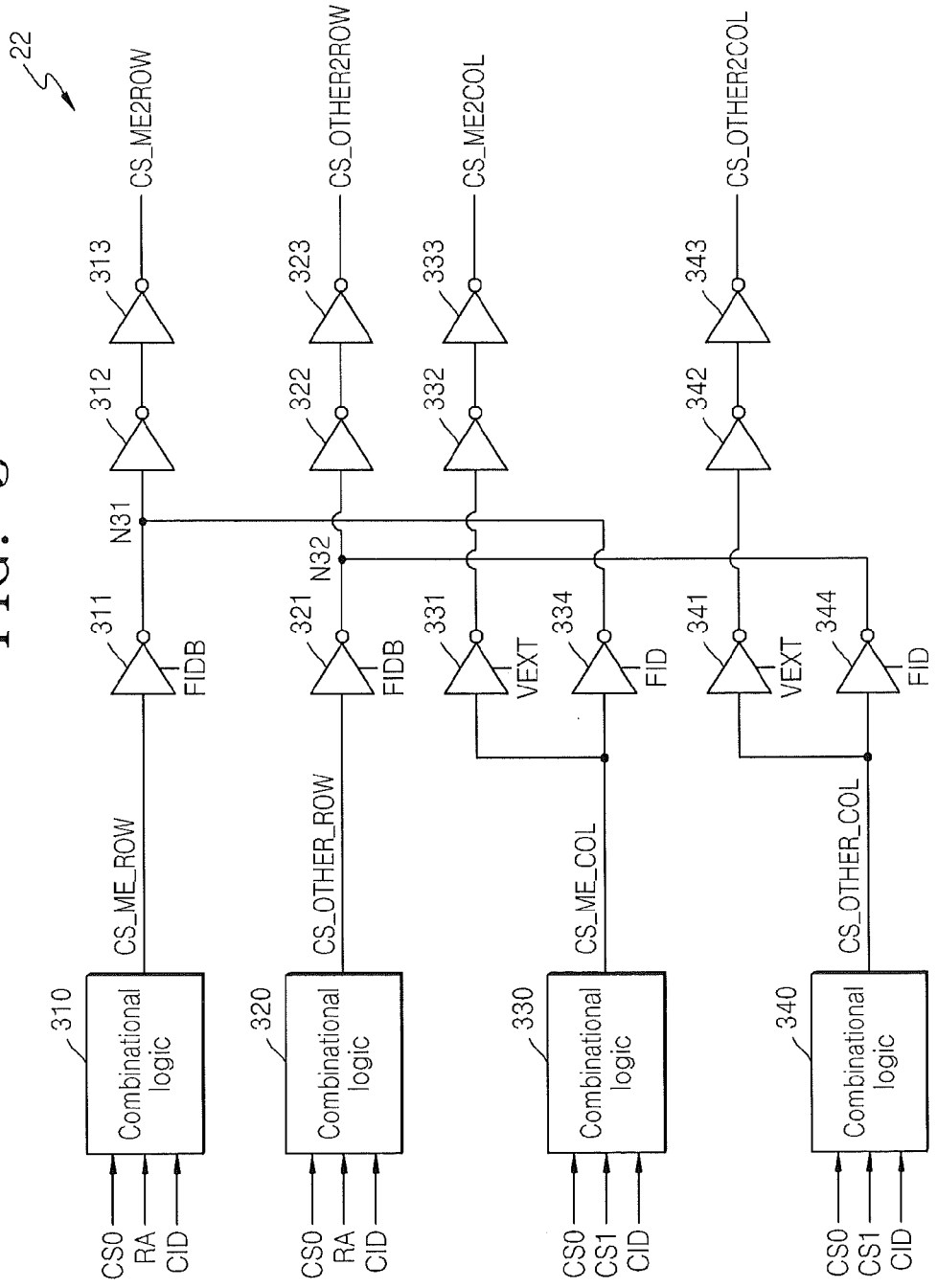
FIG. 3 is a circuit diagram of a chip select address control unit of FIG. 2.

FIG. 3 is a circuit diagram of the chip select address control unit 22 of FIG. 2.

Referring to FIG. 3, the chip select address control unit 22 includes first through fourth combination logic units 310, 320, 330, and 340, and buffers 311-313, 321-323, 331-334, and 341-344. The first through fourth combination logic units 310, 320, 330, and 340 determine whether chips of the first through fourth combination logic units 310, 320, 330, and 340 that include the chip select address control unit 22 or other chips are selected in response to the chip identification signal CID. The buffers 311, 321, 334, and 344 determine a mono-rank mode or a dual-rank mode in response to the mode signal FID.

The first combination logic unit 310 generates a first ME chip select address signal CS_ME_ROW in response to logic levels of the first chip select signal CS0, the address signal RA, and the chip select signal CID and a signal transition time. The first ME chip select address signal CS_ME_ROW is transferred to a first node N31 through the buffer 311 that responds to a complementary mode signal FIDB. A signal of the first node N31 is generated as the ME chip select row address control signal CS_ME2ROW through the buffer 312 and 313. The complementary mode signal FIDB is complementary to the mode signal FID.

In the first memory layer 12, the first ME chip select address signal CS_ME_ROW may be activated in response to the first chip select signal CS0 of a logic high level, the address signal /RA of a logic low level, and the chip select signal CID of a logic high level. Accordingly, the ME chip select row address control signal CS_ME2ROW means that the first memory layer 12 is selected and is accessed by the complementary address signal /RA. The ME chip select row address control signal CS_ME2ROW is provided to a row command decoder of the command decoder 23.

The second combination logic unit 320 generates a first OTHER chip select address signal CS_OTHER_ROW in response to logic levels of the first chip select signal CS0, the address signal RA, and the chip select signal CID and a signal transition time. The first OTHER chip select address signal CS_OTHER_ROW is transferred to a second node N32 through the buffer 321 that responds to a complementary mode signal FIDB. A signal of the second node N32 is generated as the OTHER chip select row address control signal CS_OTHER2ROW through the buffer 322 and 333.

In the first memory layer 12, the first OTHER chip select address signal CS_OTHER_ROW may be activated in response to the first chip select signal CS0 of a logic high level, the address signal RA of a logic high level, and the chip select signal CID of a logic high level. Accordingly, the OTHER chip select row address control signal CS_OTHER2ROW means that a memory layer other than the first memory layer 12 is accessed. For example, the OTHER chip select row address control signal CS_OTHER2ROW means that the second memory layer 14 is selected and is accessed by the address signal RA. The OTHER chip select row address control signal CS_OTHER2ROW is provided to the row command decoder of the command decoder 23.

The third combination logic unit 330 generates a second ME chip select address signal CS_ME_COL in response to logic levels of the first chip select signal CS0, the second chip select signal CS1, and the chip select signal CID and a signal transition time. The second ME chip select address signal CS_ME_COL is transferred to the first node N31 through the buffer 334 that responds to the mode signal FID. The signal of the first node N31 is generated as the ME chip select row address control signal CS_ME2ROW through the buffer 312 and 313.

In the first memory layer 12, the second ME chip select address signal CS_ME_COL may be activated in response to the first chip select signal CS0 of a logic high level, the second chip select signal CS1 of a logic low level, and the chip select signal CID of a logic high level. Accordingly, the ME chip select row address control signal CS_ME2ROW means that the first memory layer 12 is selected and is accessed by the second chip select signal CS1.

The second ME chip select address signal CS_ME_COL is transferred to the buffer 332 through the buffer 331 that is enabled when external power VEXT is applied, and is generated as the ME chip select column address control signal CS_ME2COL through the buffer 332 and 333. The ME chip select column address control signal CS_ME2COL is provided to a column command decoder of the command decoder 23.

The fourth combination logic unit 340 generates a second OTHER chip select address signal CS_OTHER_COL in response to logic levels of the first chip select signal CS0, the second chip select signal CS1, and the chip select signal CID and a signal transition time. The second OTHER chip select address signal CS_OTHER_COL is transferred to the second node N32 through the buffer 344 that responds to the mode signal FID. The signal of the second node N32 is generated as the OTHER chip select row address control signal CS_OTHER2ROW through the buffer 322 and 333.

In the first memory layer 12, the second OTHER chip select address signal CS_OTHER_COL may be activated in response to the first chip select signal CS0 of a logic high level, the second chip select signal CS1 of a logic high level, and the chip select signal CID of a logic high level. Accordingly, the OTHER chip select row address control signal CS_OTHER2ROW means that a memory layer other than the first memory layer 12 is accessed. For example, the OTHER chip select row address control signal CS_OTHER2ROW means that the second memory layer 14 is selected and is accessed by the second chip select signal CS1.

The second OTHER chip select address signal CS_OTHER_COL is transferred to the buffer 342 through the buffer 341 that is enabled when the external power VEXT is applied, and is generated as the OTHER chip select column address control signal CS_OTHER2COL through the buffer 342 and 343. The OTHER chip select column address control signal CS_OTHER2COL is provided to the column command decoder of the command decoder 23.

When the first memory layer 12 and the second memory layer 14 are configured in the same manner, the chip select address control unit 22 needs different command decoder paths in order to determine whether chips of the chip select address control unit 22 or other chips are selected. Accordingly, the chip select address control unit 22 provides the row command decoder of the command decoder 23 with the ME chip select row address control signal CS_ME2ROW and the OTHER chip select row address control signal CS_OTHER2ROW, and the column command decoder of the command decoder 23 with the ME chip select column address control signal CS_ME2COL and the OTHER chip select column address control signal CS_OTHER2COL.

When the first memory layer 12 is accessed by the address signal RA and the first chip select signal CS0, the chip select address control unit 22 of the first memory layer 12 activates the ME chip select row address control signal CS_ME2ROW and the ME chip select column address control signal CS_ME2COL, and deactivates the OTHER chip select row address control signal CS_OTHER2ROW and the OTHER chip select column address control signal CS_OTHER2COL. In this regard, the chip select address control unit 22b of the second memory layer 14 deactivates the ME chip select row address control signal CS_ME2ROW and the ME chip select column address control signal CS_ME2COL, and activates the OTHER chip select row address control signal CS_OTHER2ROW and the OTHER chip select column address control signal CS_OTHER2COL.

When the second memory layer 14 is accessed by the address signal RA and the first chip select signal CS0, the chip select address control unit 22b of the second memory layer 14 activates the ME chip select row address control signal CS_ME2ROW and the ME chip select column address control signal CS_ME2COL, and deactivates the OTHER chip select row address control signal CS_OTHER2ROW and the OTHER chip select column address control signal CS_OTHER2COL. In this regard, the chip select address control unit 22 of the first memory layer 12 deactivates the ME chip select row address control signal CS_ME2ROW and the ME chip select column address control signal CS_ME2COL, and activates the OTHER chip select row address control signal CS_OTHER2ROW and the OTHER chip select column address control signal CS_OTHER2COL.

FIGS. 4A through 6B illustrate data output structures of the memory device 10 of FIG. 2.

Figure 4A:
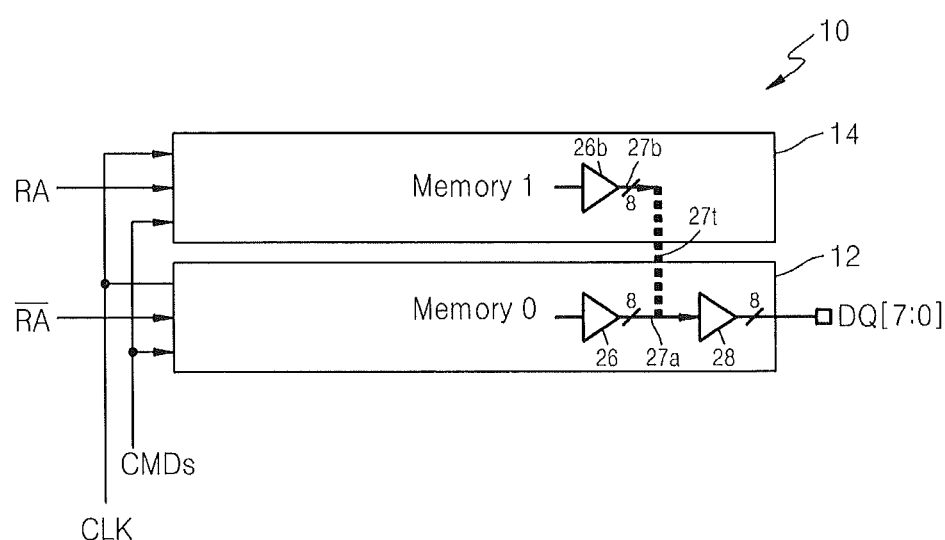
FIGS. 4A through 6B illustrate data output structures of a memory device of FIG. 2.
Figure 4B:
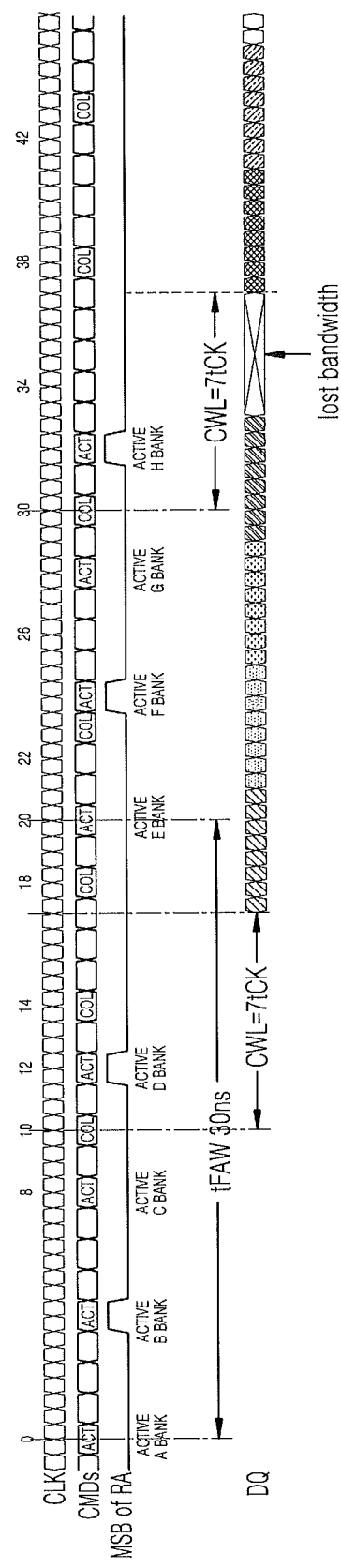
Figure 5A:
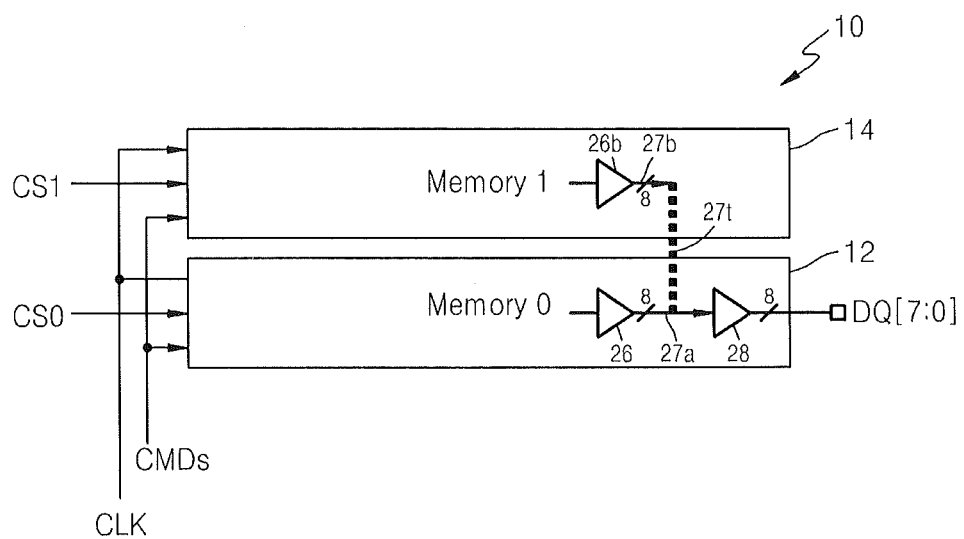
Figure 5B:
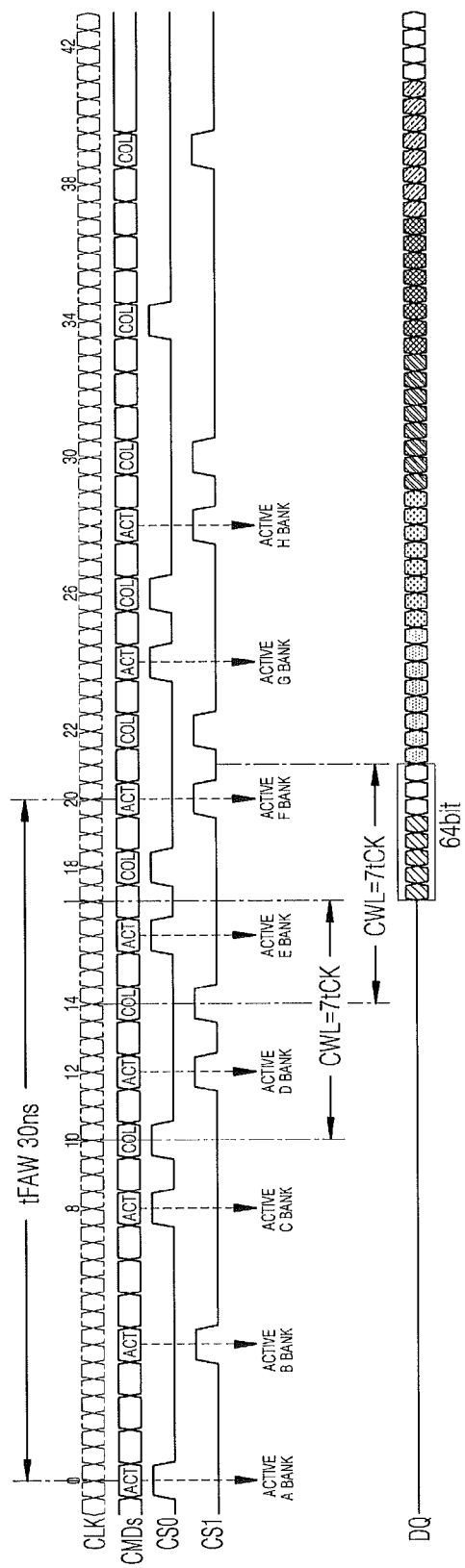
Figure 6A:
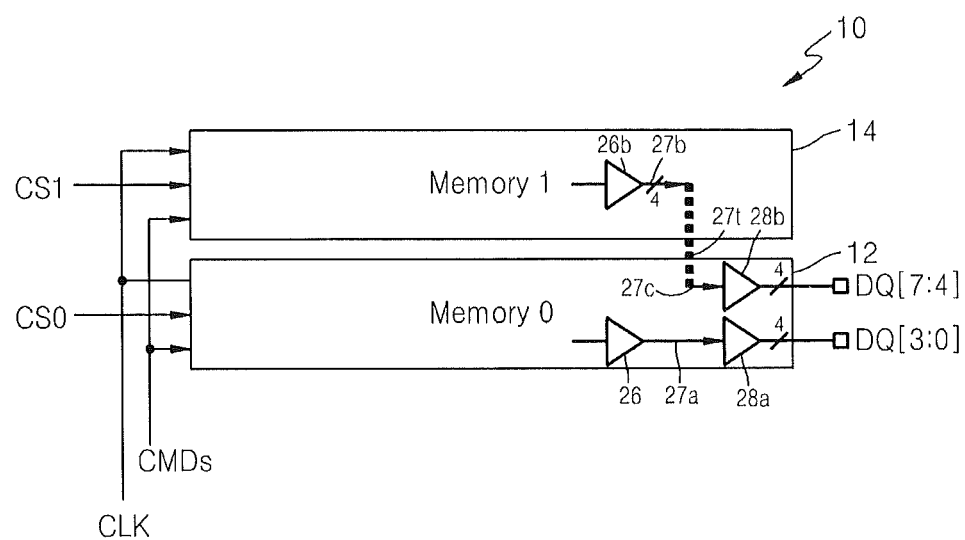
Figure 6B:
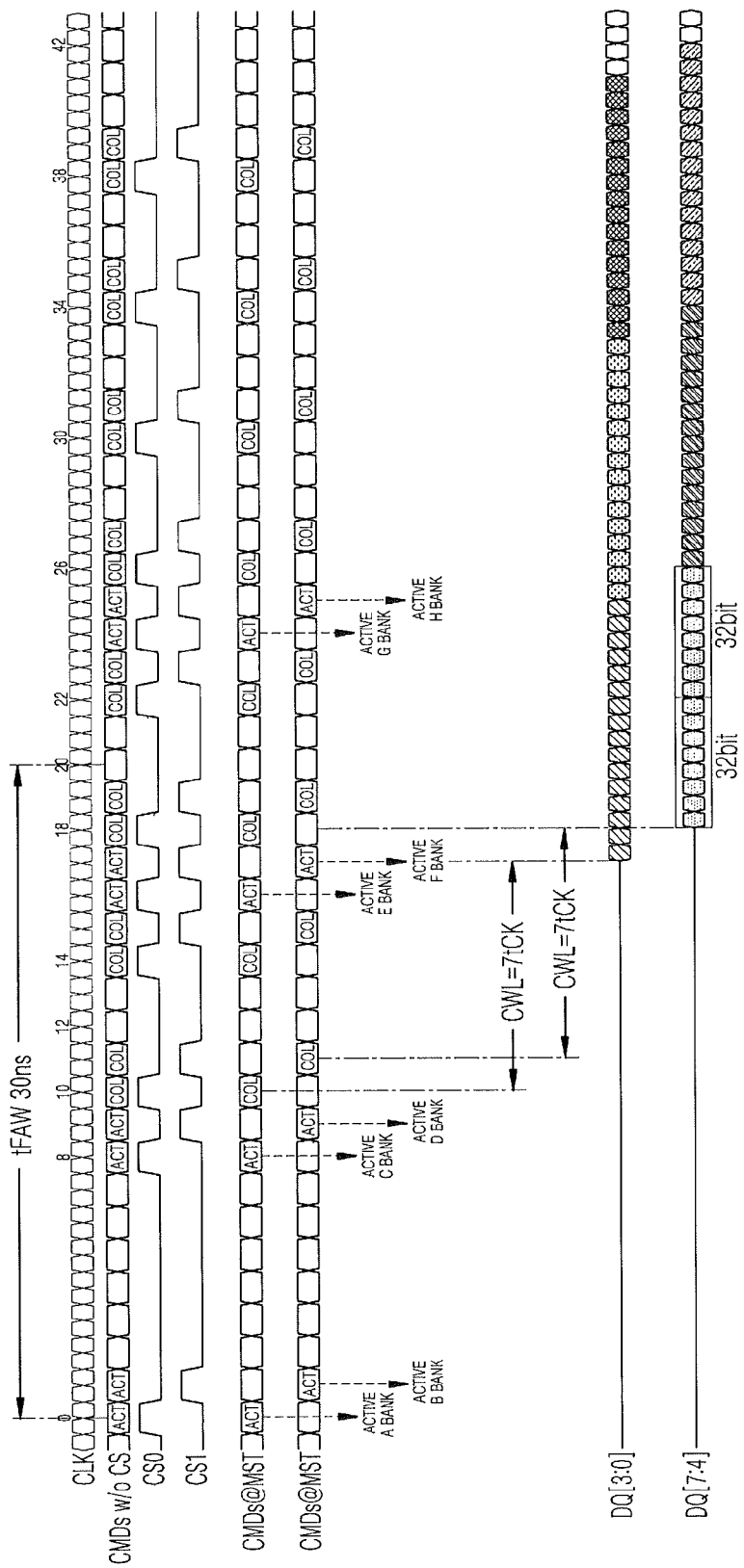

FIGS. 4A and 4B are a cross-sectional view of a single channel structure of the memory device 10 and a timing diagram thereof, respectively, when the memory device 10 operates as a mono-rank. FIGS. 5A and 5B are a cross-sectional view of a single channel structure of the memory device 10 and a timing diagram thereof, respectively, when the memory device 10 operates as a dual-rank (multi-rank). FIGS. 6A and 6B are a cross-sectional view of a threaded channel structure of the memory device 10 and a timing diagram thereof, respectively, when the memory device 10 operates as a dual-rank (multi-rank). In the single channel structure, data is output through a single channel in response to an address signal input along with an active command provided from a memory controller. In the threaded channel structure, data is output through dual channels according to a plurality of active commands provided from the memory controller.

Referring to FIG. 4A, the first memory layer 12 outputs data to the data input/output unit 26 in response to command signals CMDs input along with a clock signal CLK and the complementary address signal /RA. The data input/output unit 26 of the first memory layer 12 is connected to the data input/output line 27a. The second memory layer 14 outputs data to the data input/output unit 26b in response to the command signals CMDs input along with the clock signal CLK and the address signal RA. The data input/output unit 26b of the second memory layer 14 is connected to the data input/output line 27b.

The data input/output line 27a of the first memory layer 12 is electrically connected to the data input/output line 27b of the second memory layer 14 through a TSV 27t. The data input/output lines 27a and 27b of the first memory layer 12 and the second memory layer 14 may be configured as, for example, 8 bits. The first memory layer 12 may further include a master data input/output unit 28 for interfacing with the outside of the memory device 10 when the first memory layer 12 operates as a master chip. The data input/output line 27a of the first memory layer 12 is connected to the master data input/output unit 28. The master data input/output unit 28 is connected to the data input/output pad DQ[7:0].

The first memory layer 12 that is selected in response to the activation of the complementary address signal /RA outputs 8 bit data to the data input/output pad DQ[7:0]. The second memory layer 14 that is selected in response to the activation of the address signal RA outputs 8 bit data to the data input/output pad DQ[7:0]. That is, the memory device 10 operates as the mono-rank.

FIG. 4B is a timing diagram of inputting write data in the memory device 10 having the single channel structure and operating as the mono-rank described with reference to FIG. 4A.

Referring to FIG. 4B, write data is input into the data input/output pad DQ[7:0] in response to the command signals CMDs input along with the clock signal CLK and the address signal RA. An active command ACT and the address signal RA are received along with the sequentially input clock signal CLK. The address signal RA may be set as an MSB among address signals that address the banks A_BANK, B_BANK, C_BANK, D_BANK, E_BANK, F_BANK, G_BANK, and H_BANK of the memory cell array 25 (of FIG. 2) of the first memory layer 12 or second memory layer 14 of each of the memory devices M1, M2, . . . , M8. If the MSB of the address signal RA is a logic low level, the first memory layer 12 operating as a master chip is accessed. If the MSB of the address signal RA is a logic high level, the second memory layer 14 operating as a slave chip is accessed.

At timing 0 of the clock signal CLK, the address signal RA having the MSB of a logic low level is input by addressing the bank A A_BANK of the first memory layer 12 and the active command ACT. At timing 4 of the clock signal CLK, the address signal RA having the MSB of a logic high level is input by addressing the bank B B_BANK of the second memory layer 14 and the active command ACT. At timing 8 of the clock signal CLK, the address signal RA having the MSB of a logic low level is input by addressing the bank C C_BANK of the first memory layer 12 and the active command ACT. At timing 12 of the clock signal CLK, the address signal RA having the MSB of a logic high level is input by addressing the bank D D_BANK of the second memory layer 14 and the active command ACT.

Thereafter, at timing 20 of the clock signal CLK, the address signal RA having the MSB of a logic low level is input by addressing the bank E E_BANK of the first memory layer 12 and the active command ACT. At timing 24 of the clock signal CLK, the address signal RA having the MSB of a logic high level is input by addressing the bank F F_BANK of the second memory layer 14 and the active command ACT. In the same way, the active command ACT and the address signal RA may be continuously received along with the sequentially input clock signal CLK.

The write data input into the data input/output pad DQ[7:0] in response to the command signals CMDs input and the address signal RA along with the clock signal CLK may be sequentially input after a predetermined clock cycle, for example, 7 clock cycles 7*tCK from a column active command COL at timing 10 of the clock signal CLK. 8 bit write data to be written to the bank A A_BANK of the first memory layer 12 is input through the data input/output pad DQ[7:0]. Thereafter, 8 bit write data to be written to the bank B B_BANK of the second memory layer 14, 8 bit write data to be written to the bank C C_BANK of the first memory layer 12, and 8 bit write data to be written to the bank D D_BANK of the second memory layer 14 are sequentially input through the data input/output pad DQ[7:0].

Referring to FIGS. 4A and 4B, the write data to be written to the bank A A_BANK of the first memory layer 12 input through the data input/output pad DQ[7:0] is written to the bank A A_BANK of the first memory layer 12 through the master data input/output unit 28, the data input/output unit 27a and the data input/output unit 26 of the first memory layer 12.

The write data to be written to the bank B B_BANK of the second memory layer 14 input through the data input/output pad DQ[7:0] is written to the bank B B_BANK of the second memory layer 14 through master data input/output unit 28, the data input/output unit 27a of the first memory layer 12, the TSV 27t, the data input/output line 27b of the second memory layer 14, and the data input/output unit 26b of the second memory layer 14.

The write data to be written to the bank C C_BANK of the first memory layer 12 input through the data input/output pad DQ[7:0] is written to the bank C C_BANK of the first memory layer 12 through the master data input/output unit 28, the data input/output unit 27a and the data input/output unit 26 of the first memory layer 12.

The write data to be written to the bank D D_BANK of the second memory layer 14 input through the data input/output pad DQ[7:0] is written to the bank D D_BANK of the second memory layer 14 through the master data input/output unit 28, the data input/output unit 27a of the first memory layer 12, the TSV 27t, the data input/output line 27b of the second memory layer 14, and the data input/output unit 26b of the second memory layer 14.

Meanwhile, when the memory device 10 operates as the mono-rank and has the single channel structure, a bandwidth of the write data is lost after the write data to be written to the bank D D_BANK of the second memory layer 14 is input through the data input/output pad DQ[7:0]. Such loss occurs due to a parameter that restricts that a memory controller does not issue an additional row active command if four active commands are issued within a predetermined timing rule tFAW.

The data input/output pad DQ[7:0] of the memory device 10 is in an idle status until write data is received according to a next active command after write data is received by the data input/output pad DQ[7:0] according to the four active commands within the parameter tFAW. A section where the data input/output pad DQ[7:0] is in the idle status is a section where the bandwidth of the write data is lost.

After the loss of the bandwidth of the write data, the 8 bit write data to be written to the bank E E_BANK of the first memory layer 12 and the 8 bit write data to be written to the bank F F_BANK of the second memory layer 14 are sequentially input through the data input/output pad DQ[7:0] according to the active command ACT at timing 20 of the clock signal CLK.

The write data to be written to the bank E E_BANK of the first memory layer 12 input through the data input/output pad DQ[7:0] is written to the bank E E_BANK of the first memory layer 12 through master data input/output unit 2 and the data input/output unit 27a and the data input/output unit 26 of the first memory layer 12, The write data to be written to the bank F F_BANK of the second memory layer 14 input through the data input/output pad DQ[7:0] is written to the bank F F_BANK of the second memory layer 14 through the master data input/output unit 28, the data input/output unit 27a of the first memory layer 12, the TSV 27t, the data input/output line 27b of the second memory layer 14, and the data input/output unit 26b of the second memory layer 14.

FIGS. 5A and 5B are a cross-sectional view of a single channel structure of the memory device 10 and a timing diagram thereof when the memory device 10 operates as a dual-rank (multi-rank).

Referring to FIG. 5A, the first memory layer 12 outputs data to the data input/output unit 26 in response to the command signals CMDs input along with the clock signal CLK and the first chip select signal CS0. The data input/output unit 26 of the first memory layer 12 is connected to the data input/output line 27a. The second memory layer 14 outputs data to the data input/output unit 26b in response to the command signals CMDs input along with the clock signal CLK and the second chip select signal CS1. The data input/output unit 26b of the second memory layer 14 is connected to the data input/output line 27b.

The data input/output line 27a of the first memory layer 12 is electrically connected to the data input/output line 27b of the second memory layer 14 by using the TSV 27t. The data input/output lines 27a and 27b of the first memory layer 12 and the second memory layer 14 may be configured as, for example, 8 bits. The first memory layer 12 may further include the master data input/output unit 28 for interfacing with the outside of the memory device 10 when the first memory layer 12 operates as a master chip. The data input/output line 27a of the first memory layer 12 is connected to the master data input/output unit 28. The master data input/output unit 28 is connected to the data input/output pad DQ[7:0].

The first memory layer 12 that is selected in response to the activation of the first chip select signal CS0 outputs 8 bit data to the data input/output pad DQ[7:0]. The second memory layer 14 that is selected in response to the activation of the second chip select signal CS1 outputs 8 bit data to the data input/output pad DQ[7:0]. That is, the memory device 10 operates as a dual-rank.

FIG. 5B is a timing diagram of inputting write data in the memory device 10 having the single channel structure and operating as a dual rank described with reference to FIG. 5A.

Referring to FIG. 5B, write data is input into the data input/output pad DQ[7:0] in response to the command signals CMDs input along with the clock signal CLK and the first and second chip select signals CS0 and CS1. The active command ACT and the first and second chip select signals CS0 and CS1 are received along with the sequentially input clock signal CLK.

At timing 0 of the clock signal CLK, an address signal (not shown) that addresses the bank A A_BANK of the first memory layer 12 and the first chip select signal CS0 of a logic high level are input along with the active command ACT. At timing 4 of the clock signal CLK, an address signal (not shown) that addresses the bank B B_BANK of the second memory layer 14 and the second chip select signal CS1 of a logic high level are input along with the active command ACT. At timing 8 of the clock signal CLK, an address signal (not shown) that addresses the bank C C_BANK of the first memory layer 12 and the first chip select signal CS0 of a logic high level are input along with the active command ACT. At timing 12 of the clock signal CLK, an address signal (not shown) that addresses the bank D D_BANK of the second memory layer 14 and the second chip select signal CS1 of a logic high level are input along with the active command ACT. At timing 16 of the clock signal CLK, an address signal (not shown) that addresses the bank E E_BANK of the first memory layer 12 and the first chip select signal CS0 of a logic high level are input along with the active command ACT. At timing 20 of the clock signal CLK, an address signal (not shown) that addresses the bank F F_BANK of the second memory layer 14 and the second chip select signal CS1 of a logic high level are input along with the active command ACT. In the same way, the active command ACT and the first chip select signal CS0 or the second chip select signal CS1 may be continuously received along with the sequentially input clock signal CLK.

The write data input into the data input/output pad DQ[7:0] according to the active command ACT and the first chip select signal CS0 or the second chip select signal CS1 along with the clock signal CLK may be sequentially input after a predetermined clock cycle, for example, 7 clock cycles 7*tCK from the column active command COL at timing 10 of the clock signal CLK. That is, 8 bit write data to be written to the bank A A_BANK of the first memory layer 12 is input through the data input/output pad DQ[7:0]. Thereafter, 8 bit write data to be written to the bank B B_BANK of the second memory layer 14, 8 bit write data to be written to the bank C C_BANK of the first memory layer 12, 8 bit write data to be written to the bank D D_BANK of the second memory layer 14, 8 bit write data to be written to the bank E E_BANK of the first memory layer 12, 8 bit write data to be written to the bank F F_BANK of the second memory layer 14 may be sequentially input through the data input/output pad DQ[7:0].

Referring to FIGS. 5A and 5B, the write data to be written to the bank A A_BANK of the first memory layer 12 input through the data input/output pad DQ[7:0] is written to the bank A A_BANK of the first memory layer 12 through the master data input/output unit 28, the data input/output unit 27a and the data input/output unit 26 of the first memory layer 12.

The write data to be written to the bank B B_BANK of the second memory layer 14 input through the data input/output pad DQ[7:0] is written to the bank B B_BANK of the second memory layer 14 through master data input/output unit 28, the data input/output unit 27a of the first memory layer 12, the TSV 27t, the data input/output line 27b of the second memory layer 14, and the data input/output unit 26b of the second memory layer 14.

The write data to be written to the bank C C_BANK of the first memory layer 12 input through the data input/output pad DQ[7:0] is written to the bank C C_BANK of the first memory layer 12 through the master data input/output unit 28, the data input/output unit 27a and the data input/output unit 26 of the first memory layer 12.

The write data to be written to the bank D D_BANK of the second memory layer 14 input through the data input/output pad DQ[7:0] is written to the bank D D_BANK of the second memory layer 14 through the master data input/output unit 28, the data input/output unit 27a of the first memory layer 12, the TSV 27t, the data input/output line 27b of the second memory layer 14, and the data input/output unit 26b of the second memory layer 14.

The write data to be written to the bank E E_BANK of the first memory layer 12 input through the data input/output pad DQ[7:0] is written to the bank E E_BANK of the first memory layer 12 through the master data input/output unit 28, the data input/output unit 27a and the data input/output unit 26 of the first memory layer 12.

The write data to be written to the bank F F_BANK of the second memory layer 14 input through the data input/output pad DQ[7:0] is written to the bank F F_BANK of the second memory layer 14 through the master data input/output unit 28, the data input/output unit 27a of the first memory layer 12, the TSV 27t, the data input/output line 27b of the second memory layer 14, and the data input/output unit 26b of the second memory layer 14.

Therefore, the memory device 10 that operates as a dual-rank and has the single channel structure does not have a section where a bandwidth of the write data is not lost compared to the memory device 10 that operates as the mono-rank and has the single channel structure. As such, the bandwidth of the write data may be enhanced.

Meanwhile, the first and second memory layers 12 and 14 of the memory device 10 that operates as a dual-rank and has the single channel structure may transmit and receive read and write data according to a predetermined burst length rule. For example, if a burst length is set as 8, a data transfer size that is transmitted and received to the data input/output pad DQ[7:0] may be set as 64 bits. This means that a minimum granularity per transfer data size T_G may be 64 bits. A graphic system requiring a small granularity per transfer may need a granularity per transfer smaller than 64 bits. Thus, a threaded channel structure having dual-channels may be employed.

FIGS. 6A and 6B are a cross-sectional view of a threaded channel structure of the memory device 10 and a timing diagram thereof when the memory device 10 operates as a dual-rank. In the threaded channel structure, a scheme outputs data through dual channels according to a plurality of active commands provided from the memory controller.

Referring to FIG. 6A, the first memory layer 12 outputs data to the data input/output unit 26 in response to the command signals CMDs input along with the clock signal CLK and the first chip select signal CS0. The data input/output unit 26 of the first memory layer 12 is connected to the data input/output line 27a. The second memory layer 14 outputs data to the data input/output unit 26b in response to the command signals CMDs input along with the clock signal CLK and the second chip select signal CS1. The data input/output unit 26b of the second memory layer 14 is connected to the data input/output line 27b. The data input/output line 27b of the second memory layer 14 is electrically connected to a second data input/output line 27c of the first memory layer 12 by using the TSV 27t.

The first memory layer 12 may further include first and second master data input/output units 28a and 28b for interfacing with the outside of the memory device 10 when the first memory layer 12 operates as a master chip. The data input/output line 27a of the first memory layer 12 is connected to the first master data input/output unit 28a. The first master data input/output unit 28a is connected to a first data input/output pad DQ[3:0]. The second data input/output line 27c of the first memory layer 12 is connected to the second master data input/output unit 28b. The second master data input/output unit 28b is connected to a second data input/output pad DQ[7:4].

The first memory layer 12 that is selected in response to the activation of the first chip select signal CS0 outputs 4 bit data to the first data input/output pad DQ[3:0]. The second memory layer 14 that is selected in response to the activation of the second chip select signal CS1 outputs 4 bit data to the second data input/output pad DQ[7:4]. That is, the memory device 10 includes dual-channels including a first path to the first data input/output pad DQ[3:0] and a second path to the second data input/output pad DQ[7:4], and operates as a dual rank.

FIG. 6B is a timing diagram of inputting write data in the memory device 10 having the threaded channel structure and operating as a dual rank described with reference to FIG. 6A.

Referring to FIG. 6B, write data is input into the first data input/output pad DQ[3:0] and the second data input/output pad DQ[7:4] in response to the command signals CMDs input along with the clock signal CLK and the first chip select signal CS0 or the second chip select signal CS1. The active command ACT and the first and second chip select signals CS0 and CS1 are received along with the sequentially input clock signal CLK.

At timing 0 of the clock signal CLK, an address signal (not shown) that addresses the bank A A_BANK of the first memory layer 12 and the first chip select signal CS0 of a logic high level are input along with the active command ACT. At timing 1 of the clock signal CLK, an address signal (not shown) that addresses the bank B B_BANK of the second memory layer 14 and the second chip select signal CS1 of a logic high level are input along with the active command ACT. At timing 8 of the clock signal CLK, an address signal (not shown) that addresses the bank C C_BANK of the first memory layer 12 and the first chip select signal CS0 of a logic high level are input along with the active command ACT. At timing 9 of the clock signal CLK, an address signal (not shown) that addresses the bank D D_BANK of the second memory layer 14 and the second chip select signal CS1 of a logic high level are input along with the active command ACT. At timing 16 of the clock signal CLK, an address signal (not shown) that addresses the bank E E_BANK of the first memory layer 12 and the first chip select signal CS0 of a logic high level are input along with the active command ACT. At timing 17 of the clock signal CLK, an address signal (not shown) that addresses the bank F F_BANK of the second memory layer 14 and the second chip select signal CS1 of a logic high level are input along with the active command ACT. In the same way, the active command ACT and the first chip select signal CS0 or the second chip select signal CS1 may be continuously received along with the sequentially input clock signal CLK.

The write data input into the first data input/output pad DQ[3:0] according to the active command ACT and the first chip select signal CS0 or the second chip select signal CS1 along with the clock signal CLK may be sequentially input after a predetermined clock cycle, for example, 7 clock cycles 7*tCK from the column active command COL at timing 10 of the clock signal CLK. That is, 4 bit write data to be written to the bank A A_BANK of the first memory layer 12 is input through the first data input/output pad DQ[3:0] during 4 cycles. Thereafter, 4 bit write data to be written to the bank C C_BANK of the first memory layer 12 is input through the first data input/output pad DQ[3:0] during 4 cycles. Thereafter, 4 bit write data to be written to the bank E E_BANK of the first memory layer 12 is input through the first data input/output pad DQ[3:0] during 4 cycles.

The 4 bit write data to be written to the bank B B_BANK of the second memory layer 14 is input through the second data input/output pad DQ[7:4] during 4 cycles. Thereafter, 4 bit write data to be written to the bank D D_BANK of the second memory layer 14 is input through the second data input/output pad DQ[7:4] during 4 cycles. The 4 bit write data to be written to the bank F F_BANK of the second memory layer 14 is input through the second data input/output pad DQ[7:4] during 4 cycles.

The memory device 10 having the threaded channel structure and operating as a dual rank may reduce a minimum granularity per transfer data size to 32 bits. Thus, the memory device 10 may be suitable for a system, such as a graphic system requiring a small granularity per transfer.

Figure 7:
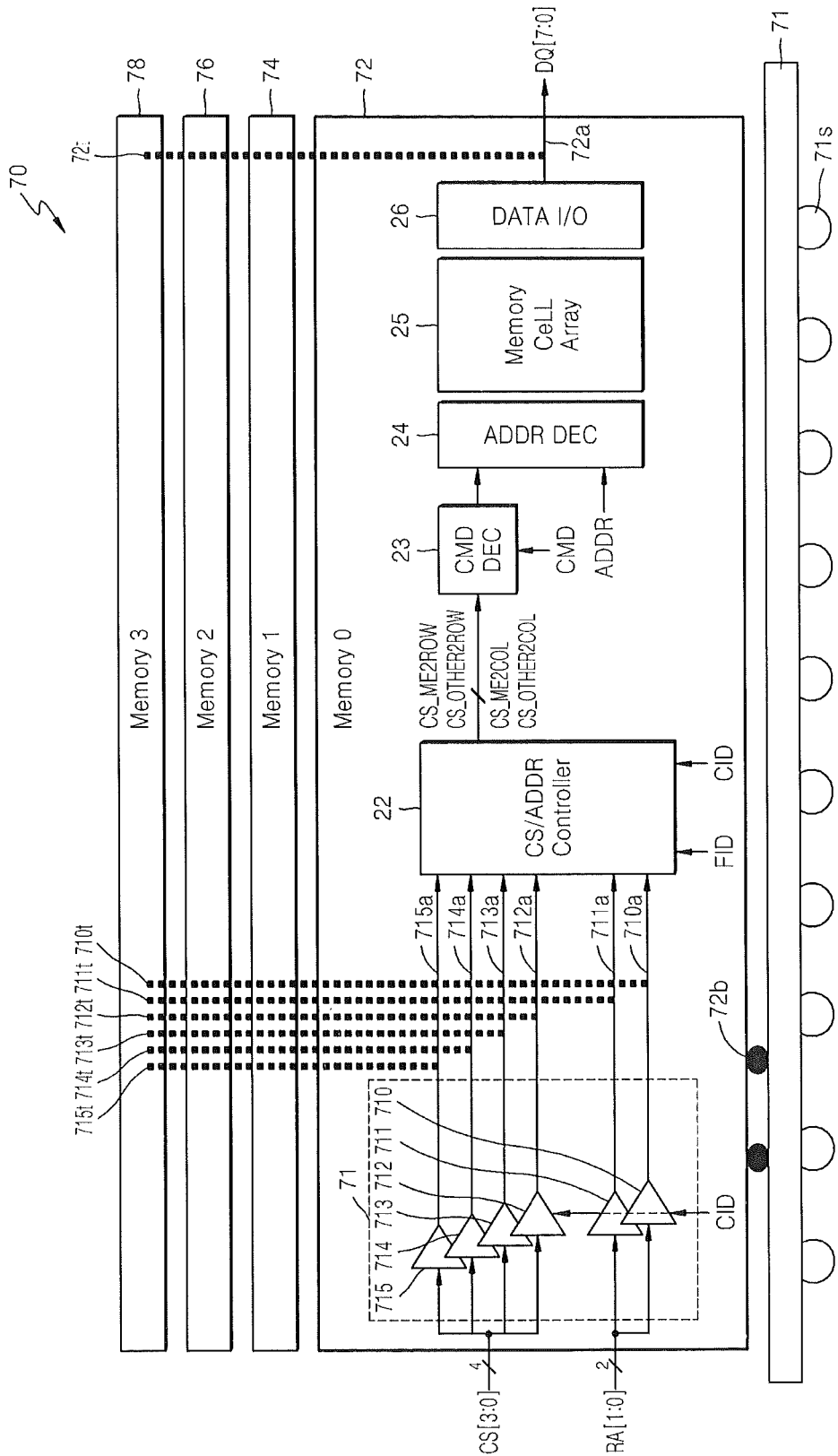
FIG. 7 is a block diagram of a memory device compatible with a mono-rank or multi-ranks, according to some embodiments of the inventive concept.

FIG. 7 is a block diagram of the memory device 70 compatible with a mono-rank or multi-ranks, according to some embodiments of the inventive concept.

Referring to FIG. 7, the memory device 70 is packaged by stacking a plurality of memory layers 72, 74, 76, and 78 on a PCB 71. Solder balls 71s that are external terminals are disposed in a rear surface of the PCB 71. The solder balls 71s are connected to the address signals RA, CA, the chip select signals CS0, CS1, the clock signal CK, the clock enable signal CKE, the row address strobe signal RAS, the column address strobe signal CAS, the write enable signal WE, the power voltage VDD, and the ground signal VSS. These command and address signals may be provided from a memory controller, and may be electrically connected to the first memory chip 72 by using bumps 72b.

Although the first through fourth memory layers 72, 74, 76, and 78 are stacked in the present embodiment, the inventive concept is not limited thereto, and n(n>4) memory layers may be stacked.

The memory device 70 has a stack structure in which the first through fourth memory layers 72, 74, 76, and 78 are connected to each other by using TSVs 710t, 711t, 712t, 713t, 714t, and 715t and micro bumps (not shown).

Although the memory device 70 has the stack structure in which the first through fourth memory layers 72, 74, 76, and 78 are connected to each other by using the TSVs 710t, 711t, 712t, 713t, 714t, and 715t and micro bumps in the present embodiments, the inventive concept is not limited thereto, and the memory device 70 may have a stack structure in which the first through fourth memory layers 72, 74, 76, and 78 are connected to each other by using a wire bonding, interposer, and/or a tape including wires.

Further, the first through fourth memory layers 72, 74, 76, and 78 are connected to each other by using a radiative method that uses a RF or ultrasound, an inductive coupling method that uses magnetic induction, or a non-radiative method that uses magnetic field resonance.

The first through fourth memory layers 72, 74, 76, and 78 may have the same elements as those of the first memory layer 12 described with reference to FIG. 2. That is, the first through fourth memory layers 72, 74, 76, and 78 may include a buffer unit 71, the chip select address control unit 22, the command decoder 23, the address decoder 24, the memory cell array 25, and the data input/output unit 26. However, the buffer unit 71 may be differently configured according to the number of stacked memory layers. The redundant descriptions of the elements except the buffer unit 71 will not be provided.

The buffer unit 71 of the first memory layer 72 receives 2 bit address signals RA[1:0] and 4 bit chip select signals CS[3:0] in response to the chip identification signal CID. The chip identification signal CID identifies the first memory layer 72. The chip identification signal CID is provided by a fuse box (not shown) disposed in the first memory layer 72. The fuse box includes a plurality of fuses. The chip identification signal CID is set by combinations of the selectively cut fuses included in the fuse box.

The address signals RA[1:0] and the chip select signals CS[3:0] may be provided by a memory controller. The address signals RA[1:0] may be row address signals that address word lines of the memory cell array 25. The address signals RA[1:0] may be set as 2 bit MSB among address signals that address the banks A_BANK, B_BANK, C_BANK, D_BANK, E_BANK, F_BANK, G_BANK, and H_BANK of the memory cell array 25. The memory controller may provide column address signals CA[1:0] instead of the address signals RA[1:0]. The column address signals CA[1:0] address bit lines of the memory cell array 25. The first chip select signal CS0 may select the first memory layer 72. The second chip select signal CS1 may select the second memory layer 74. A third chip select signal CS2 may select the third memory layer 76. A fourth chip select signal CS3 may select the fourth memory layer 78.

The buffer unit 71 includes a first buffer 710 that receives a first address signal RA0, a second buffer 711 that receives a second address signal RA1, a third buffer 712 that receives the first chip select signal CS0, a fourth buffer 713 that receives the second chip select signal CS1, a fifth buffer 714 that receives the third chip select signal CS2, and a sixth buffer 715 that receives the fourth chip select signal CS3 in response to the chip select signal CID. The address signals RA[1:0] and the chip select signals CS[3:0] are transmitted to the chip select address control unit 22.

The first through sixth buffers 710 through 715 of the first memory layer 72 transmit the address signals RA[1:0] and the chip select signals CS[3:0] to output signal lines 710a through 715a. The output signal lines 710a through 715a of the buffer unit 71 of the first memory layer 72 are electrically connected to the second through fourth memory layers 74, 76, and 78 by using the TSVs 710t through 715t.

The data input/output unit 26 of the first memory layer 72 drives write data and read data to and from the memory cell array 25. Likewise, data input/output units of the second through fourth memory layers 74, 76, and 78 drive write data and read data to and from corresponding memory cell arrays.

A data input/output line 72a connected to the data input/output unit 26 of the first memory layer 72 is electrically connected to data input/output lines connected to data input/output units of the second through fourth memory layers 74, 76, and 78 by using the TSV 72t.

The first through fourth memory layers 72, 74, 76, and 78 of the memory device 70 may operate as the mono-rank or multi-ranks by combinations of the address signals RA[1:0] and the chip select signals CS[3:0] received in the buffer unit 71.

FIGS. 8A through 8E are cross-sectional views of the memory device 70 compatible with a mono-rank Rank0 or multi-ranks Ranks 0 through 3 of FIG. 7.

Figure 8A:
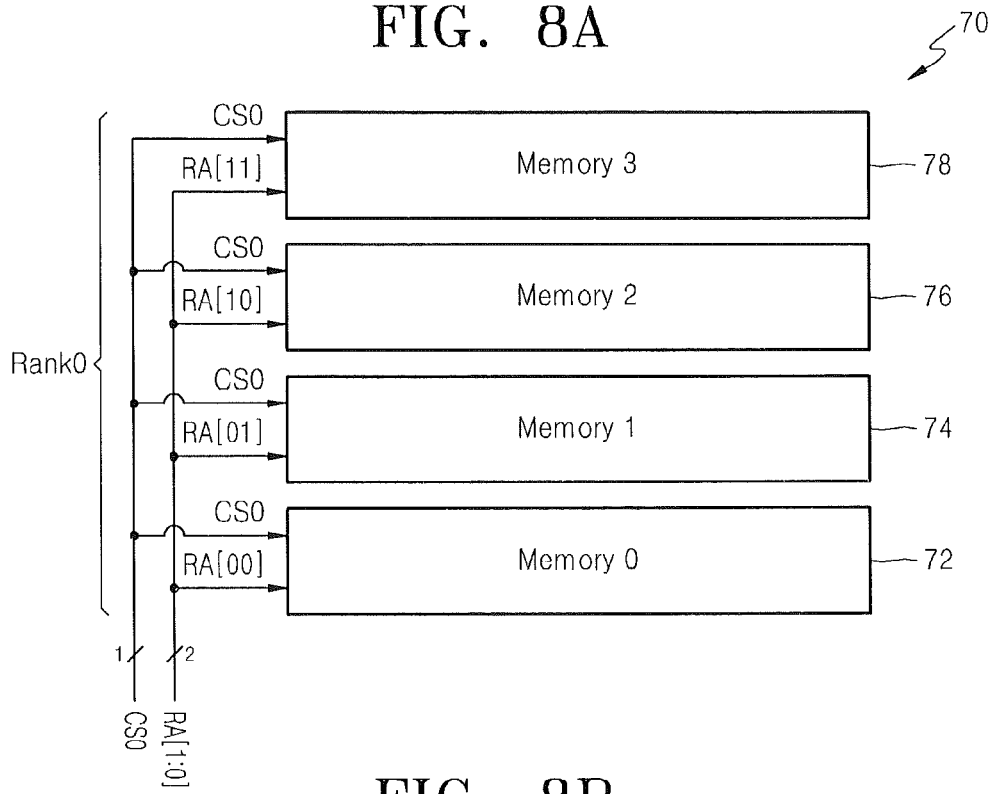
FIGS. 8A through 8E are cross-sectional views of a memory device compatible with a mono-rank or multi-ranks of FIG. 7.

Referring to FIG. 8A, the memory device 70 operates as the mono-rank Rank 0 in which the first through fourth memory layers 72, 74, 76, and 78 are selected by the one chip select signal CS0. Each of the first through fourth memory layers 72, 74, 76, and 78 is selected by combinations of 2 bit address signals RA[1:0]. The first memory layer 72 is accessed by a "00" bit signal of the address signals RA[1:0], the second memory layer 74 is accessed by a "01" bit signal of the address signals RA[1:0], the third memory layer 76 is accessed by a "10" bit signal of the address signals RA[1:0], and the fourth memory layer 78 is accessed by a "11" bit signal of the address signals RA[1:0].

Figure 8B:
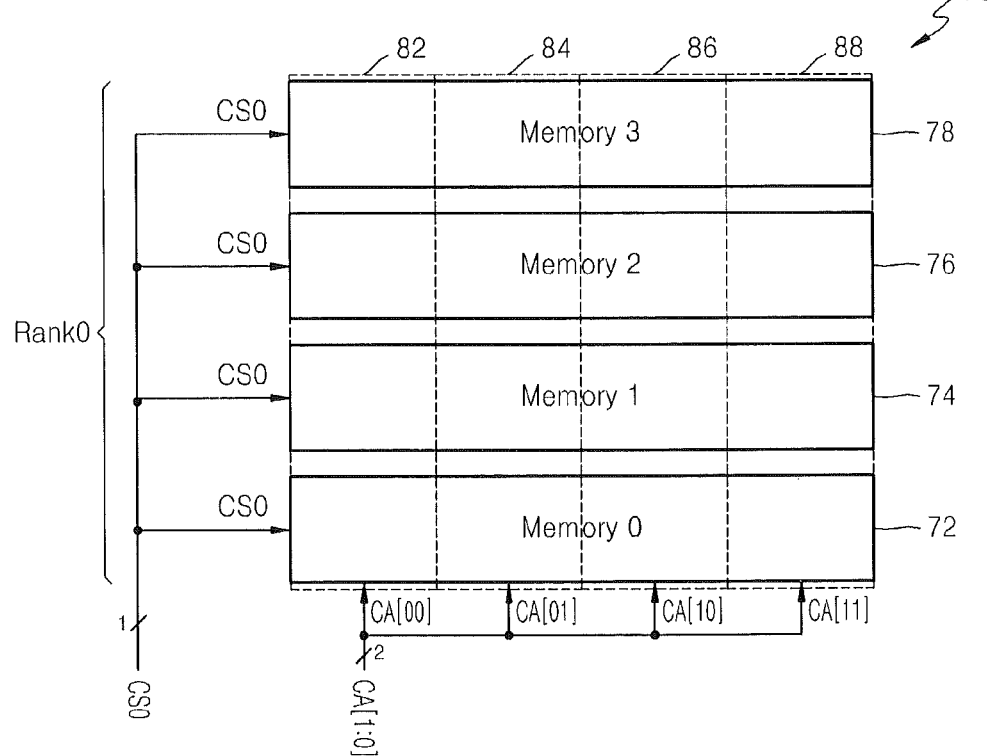

Referring to FIG. 8B, the memory device 70 operates as the mono-rank Rank 0 in which the first through fourth memory layers 72, 74, 76, and 78 are selected by the one chip select signal CS0. Each of the first through fourth memory layers 72, 74, 76, and 78 is divided by four bank groups 82, 84, 86, and 88 selected by combinations of 2 bit column address signals CA[1:0]. The first bank group 82 is accessed by a "00" bit signal of the column address signals CA[1:0], the second bank group 84 is accessed by a "01" bit signal of the column address signals CA[1:0], the third bank group 86 is accessed by a "10" bit signal of the column address signals CA[1:0], and the fourth bank group 88 is accessed by a "11" bit signal of the column address signals CA[1:0].

Figure 8C:
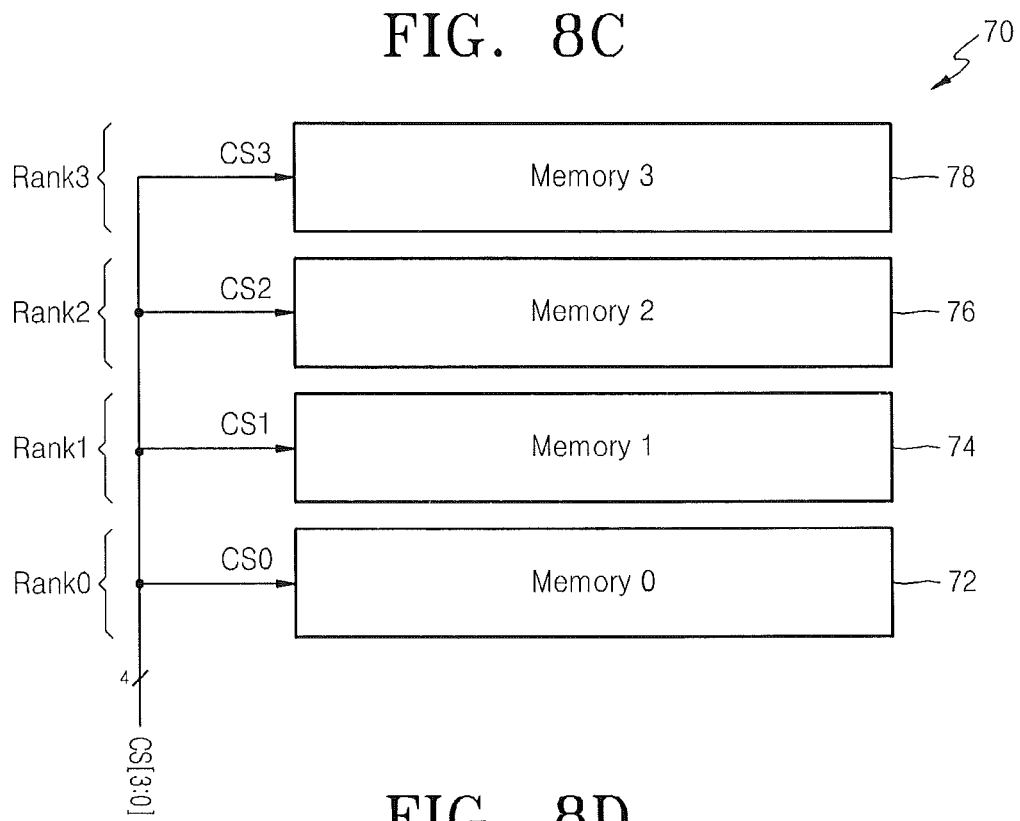

Referring to FIG. 8C, the memory device 70 operates as the multi-ranks Ranks 0 through 3 in which the first through fourth memory layers 72, 74, 76, and 78 are selected by the four chip select signals CS[3:0], respectively. The first memory layer 72 operates as the rank Rank0 in which the first memory layer 72 is accessed by the first chip select signal CS0. The second memory layer 74 operates as the rank Rank1 in which the second memory layer 74 is accessed by the second chip select signal CS1. The third memory layer 76 operates as the rank Rank2 in which the third memory layer 76 is accessed by the third chip select signal CS2. The fourth memory layer 78 operates as the rank Rank3 in which the fourth memory layer 78 is accessed by the fourth chip select signal CS3.

Figure 8D:
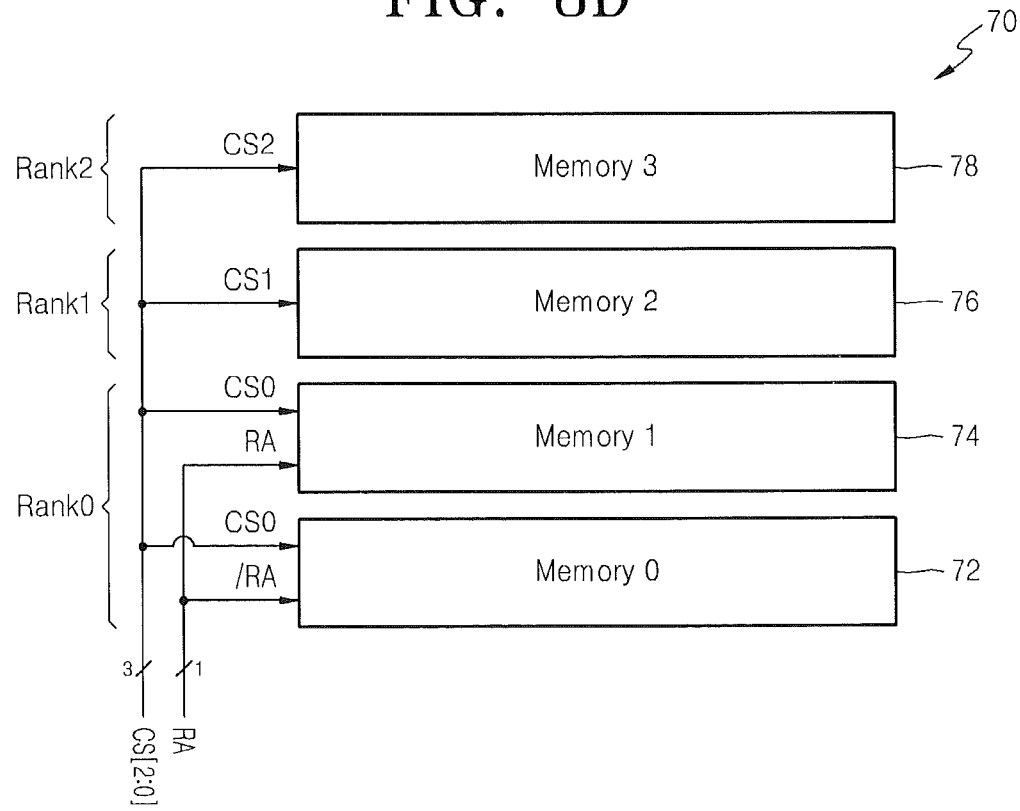

Referring to FIG. 8D, the memory device 70 has a complex memory structure in which the first through fourth memory layers 72, 74, 76, and 78 operate as the mono-rank Rank0 and the multi-ranks Ranks0, Rank1, and Rank2. The first memory layer 72 and the second memory layer 74 operate as the mono-rank, i.e. the rank Rank0, in which the first memory layer 72 and the second memory layer 74 are selected by the first chip select signal CS0 and are selectively accessed by the 1 bit row address signal RA. The third memory layer 76 operates as the rank Rank1 in which the third memory layer 76 is accessed by the second chip select signal CS1. The fourth memory layer 78 operates as the rank Rank2 in which the fourth memory layer 78 is accessed by the third chip select signal CS2. The first and second memory layers 72 and 74, the third memory layer 76, and the fourth memory layer 78 operate as the multi-ranks Rank0, Rank1, and Rank2.

Figure 8E:
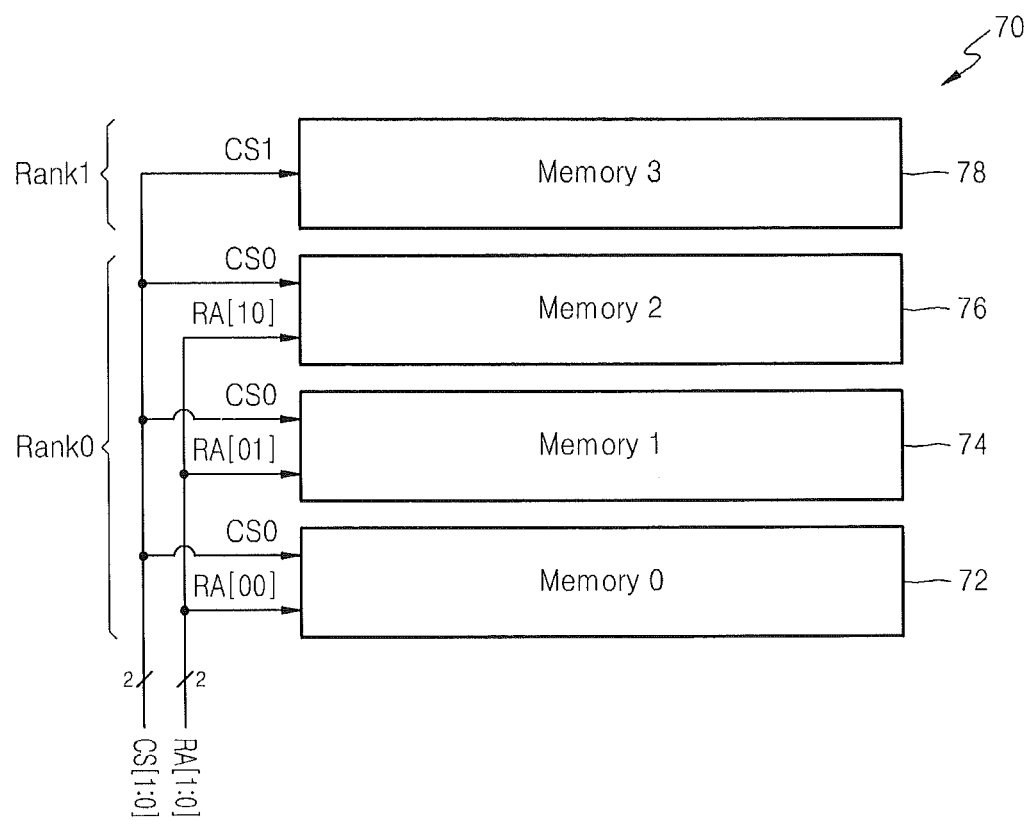

Referring to FIG. 8E, the memory device 70 has another complex memory structure in which the first through fourth memory layers 72, 74, 76, and 78 operate as the mono-rank Rank0 or the multi-ranks Ranks0 and Rank1, The first through third memory layer 72, 74, and 76 operate as the mono-rank, i.e. the rank Rank0, in which the first through third memory layer 72, 74, and 76 are selected by the first chip select signal CS0 and are selectively accessed by the 2 bit row address signal RA[1:0]. The fourth memory layer 78 operates as the rank Rank1 in which the fourth memory layer 78 is accessed by the second chip select signal CS1. The first through third memory layer 72, 74, and 76, and the fourth memory layer 78 operate as the multi-ranks Ranks0 and Rank1.

Figure 9A:
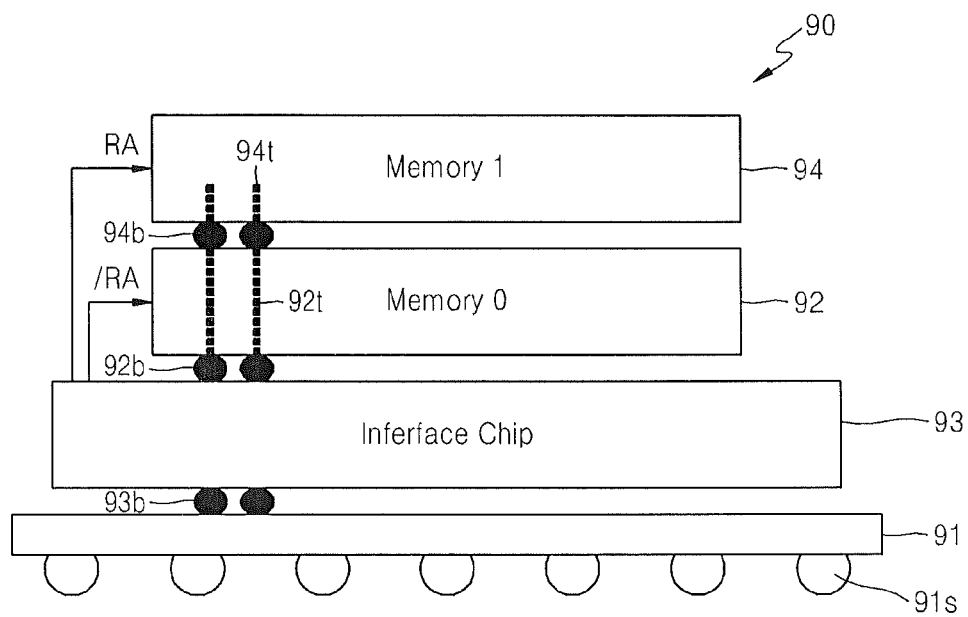
FIGS. 9A and 9B are cross-sectional views of a memory device compatible with a mono-rank or dual-ranks, according to some embodiments of the inventive concept.
Figure 9B:
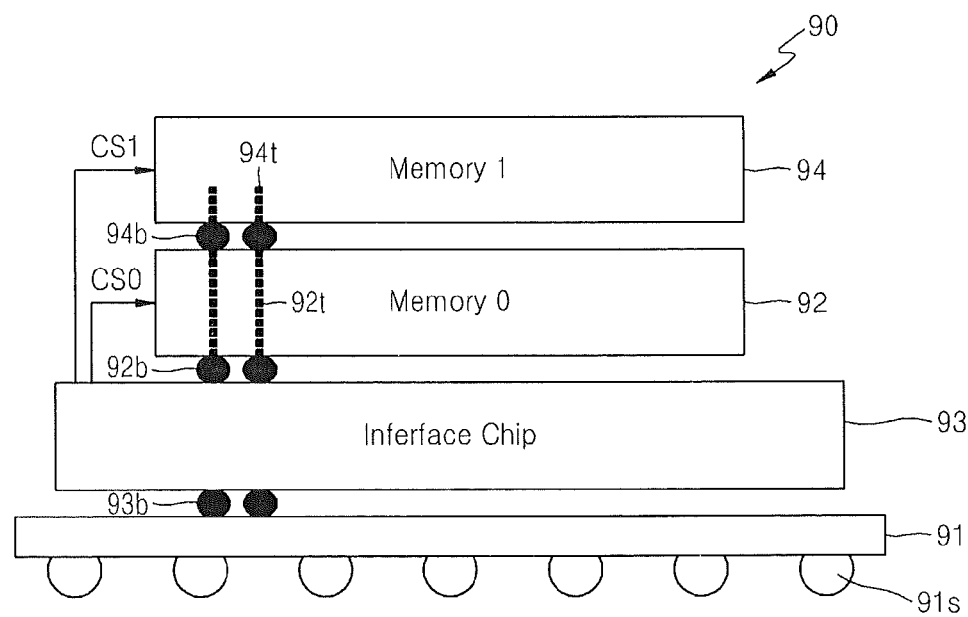

FIGS. 9A and 9B are cross-sectional views of a memory device 90 compatible with a mono-rank or dual-ranks, according to other embodiments of the inventive concept.

Referring to FIG. 9A, the memory device 90 is packaged by stacking an interface chip 93, a first memory chip 92, and a second memory chip 94 on a PCB 91. Solder balls 91s that are external terminals are disposed in a rear surface of the PCB 91. The solder balls 91s are connected to the address signals RA, CA, the chip select signals CS0, CS1, the clock signal CK, the clock enable signal CKE, the row address strobe signal RAS, the column address strobe signal CAS, the write enable signal WE, the power voltage VDD, and the ground signal VSS. These command and address signals may be provided from a memory controller, and may be electrically connected to the interface chip 93 by using bumps 93b.

Although the memory device 90 includes the two memory chips 92 and 94 stacked in the interface chip 93, the inventive concept is not limited thereto, and two or more memory chips may be stacked.

The interface chip 93 includes a master circuit region for interfacing with the outside of the memory device 90. The first memory chip 92 and the second memory chip 94 may include a core circuit unit in which memory cells are formed. The first memory chip 92 and the second memory chip 94 may further include a peripheral circuit unit in which peripheral circuits are formed with respect to memory cells. If the first memory chip 92 and the second memory chip 94 include the core circuit unit, the interface chip 93 may further include the peripheral circuit unit.

The first memory chip 92 and the second memory chip 94 are electrically connected to the master circuit region of the interface chip 93 so that the core circuit unit and the peripheral circuit unit included therein perform read/write operations. Alternatively, the first memory chip 92 and the second memory chip 94 are electrically connected to the master circuit region and the peripheral circuit unit of the interface chip 93 so that the core circuit unit included therein performs read/write operations.

The memory device 90 has a stack structure in which the interface chip 93, the first memory chip 92, and the second memory chip 94 are electrically connected to each other by using TSVs 92t and 94t and micro bumps 92b and 94b. Although the memory device 90 has the stack structure in which the interface chip 93, the first memory chip 92, and the second memory chip 94 are electrically connected to each other by using TSVs 92t and 94t and micro bumps 92b and 94b in the present embodiment, the inventive concept is not limited thereto, and the memory device 90 may have a stack structure in which the interface chip 93, the first memory chip 92, and the second memory chip 94 are electrically connected to each other by using a wire bonding, interposer, and/or a tape including wires.

Further, the interface chip 93, the first memory chip 92, and the second memory chip 94 may be electrically connected to each other by using a radiative method that uses a RF or ultrasound, an inductive coupling method that uses magnetic induction, or a non-radiative method that uses magnetic field resonance.

In FIG. 9A, the memory device 90 may operate as a mono-rank in which the first memory chip 92 and the second memory chip 94 are selected by one chip select signal (not shown). The first memory chip 92 and the second memory chip 94 are selectively accessed by address signals /RA, RA. The chip select signal (not shown) and the address signals /RA, RA are provided by the interface chip 93. The first memory chip 92 is accessed by the address signal /RA. The second memory chip 94 is accessed by the address signal RA.

In FIG. 9B, the memory device 90 may operate as a dual-rank in which the first memory chip 92 and the second memory chip 94 are selected by the two chip select signals CS0 and CS1. The first memory chip 92 and the second memory chip 94 are selectively accessed by the chip select signals CS0 and CS1. The first memory chip 92 is accessed by the chip select signal CS0. The second memory chip 94 is accessed by the chip select signal CS1.

Figure 10:
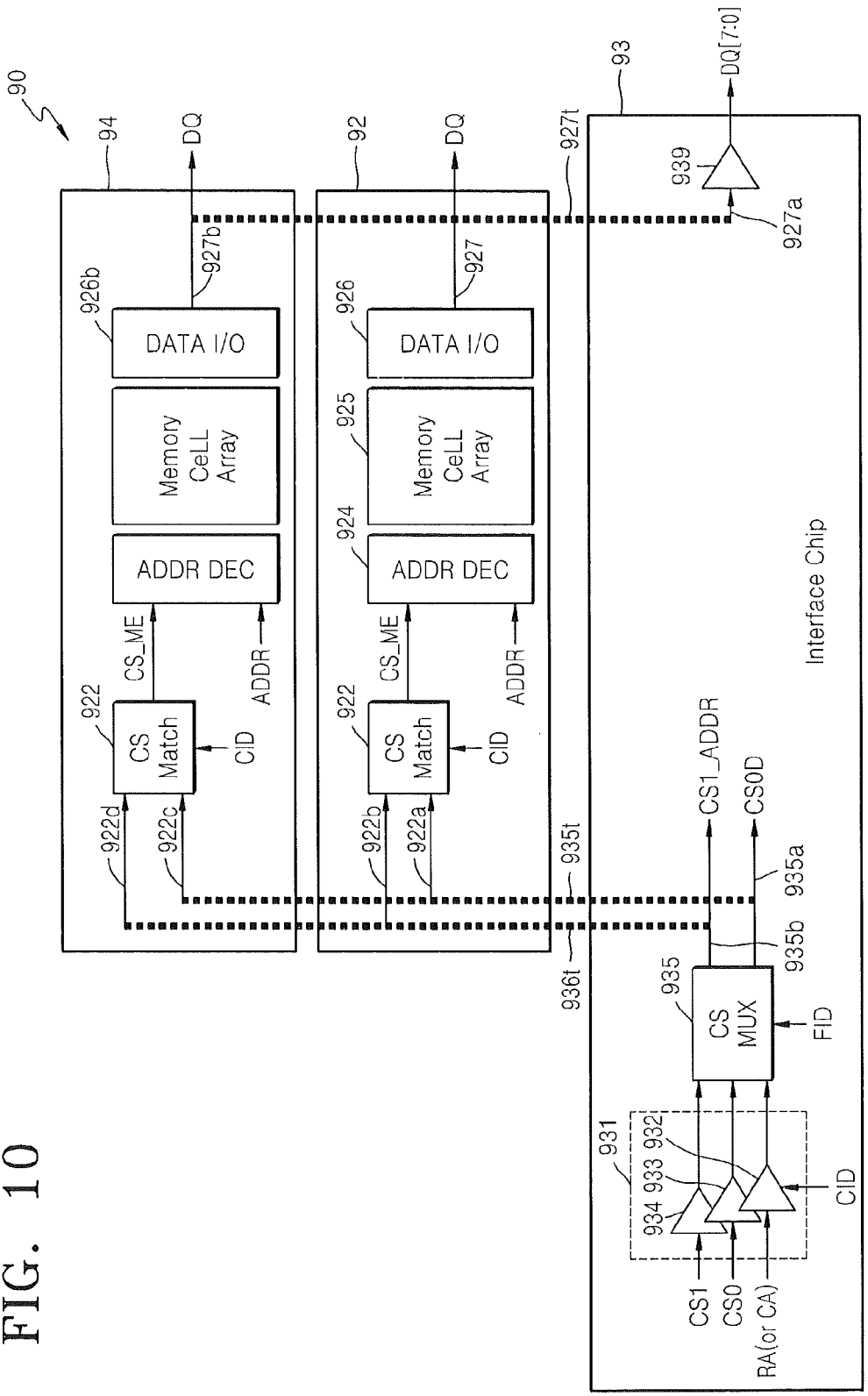
FIG. 10 is a block diagram of the memory device compatible with a mono-rank or dual-rank described with reference to FIG. 9.

FIG. 10 is a block diagram of the memory device 90 compatible with a mono-rank or dual-rank described with reference to FIG. 9.

Referring to FIG. 10, the memory device 90 includes the interface chip 93, the first memory chip 92, and the second memory chip 94 stacked in on package. The interface chip 93, the first memory chip 92 and the second memory chip 94 are stacked in one package, and thus, for descriptive convenience, the interface chip 93 is referred to as an interface layer, the first memory chip 92 and the second memory chip 94 are referred to as a first memory layer and a second memory layer, respectively.

The interface layer 93 includes a buffer unit 931, a chip select MUX unit 935, and a mater data input/output unit 939. The interface layer 93 may be connected to command and address signals provided by a memory controller.

The buffer unit 931 receives the address signal RA, the first chip select signal CS0, and the second chip select signal CS1 in response to the chip identification signal CID. The chip identification signal CID identifies the first memory chip 92 or the second memory chip 94. The chip identification signal CID is provided by a fuse box (not shown) disposed in the interface layer 92. The fuse box includes a plurality of fuses. The chip identification signal CID is set by combinations of the selectively cut fuses included in the fuse box.

The address signal RA, the first chip select signal CS0, and the second chip select signal CS1 may be provided by the memory controller. The address signal RA may be a row address signal that addresses word lines of the memory cell array 25 of the first memory chip 92 and the second memory chip 94. In particular, the address signal RA may be set as a MSB among address signals that address a plurality of banks of the memory cell array 25. The memory controller may provide the column address signal CA instead of the row address signal RA. The column address signal CA addresses bit lines of the memory cell array 25. The first chip select signal CS0 may select the first memory layer 92. The second chip select signal CS1 may select the second memory layer 94.

The buffer unit 931 includes a first buffer 932 that receives the address signal RA, a second buffer 933 that receives the first chip select signal CS0, and a third buffer 934 that receives the second chip select signal CS1. The address signal RA, the first chip select signal CS0, and the second chip select signal CS1 that are received by the buffer unit 931 are transmitted to the chip select MUX unit 935.

The chip select MUX unit 935 generates a first chip select control signal CD0D and a second chip select control signal CS1_ADDR according to the address signal RA, the first chip select signal CS0, and the second chip select signal CS1 that are transmitted from the buffer unit 931 in response to the mode signal FID that determines a mono-rank mode or a dual-rank mode. The mode signal FID may be provided by a fuse box (not shown) disposed in the interface layer 93. The fuse box includes a plurality of fuses. The mode signal FID is set by combinations of the selectively cut fuses included in the fuse box. The mode signal FID may be also set according to bit information stored in the mode register MRS of the interface layer 93.

The first chip select control signal CS0D of the chip select MUX unit 935 is output to a first signal line 935a, and the second chip select control signal CS1_ADDR thereof is output to a second signal line 935b. The first signal line 935a and the second signal line 935b are connected to a chip select matching unit 922 of the first memory chip 92 and the second memory chip 94 by using TSVs 935t and 936t.

The master data input/output unit 939 is a data input/output unit for interfacing with the outside of the memory device 90. The master data input/output unit 939 is connected to the data input/output pad DQ[7:0].

The first memory layer 92 includes the chip select matching unit 922, an address decoder 924, a memory cell array 925, and a data input/output unit 926. The second memory layer 94 may be configured in the same manner as the first memory layer 92.

The chip select matching unit 922 of the first memory layer 92 receives the first chip select control signal CS0D and the second chip select control signal CS1_ADDR by using the TSVs 935t and 936t. The chip select matching unit 922 receives the first chip select control signal CS0D in a signal line 922a connected by using the first TSV 935t and the second chip select control signal CS1_ADDR in a signal line 922b connected by using the second TSV 936t.

The chip select matching unit 922 generates a ME chip select signal CS_ME in response to the chip select signal CID, the first chip select control signal CS0D, and the second chip select control signal CS1_ADDR.

The address decoder 924 includes a row decoder and a column decoder that address memory cells, and activates word lines and bit lines that select memory cells in response to the ME chip select signal CS_ME and the address signal ADDR. The memory cell array 925 may include a plurality of banks.

The data input/output unit 926 drives write data and read data to and from the memory cell array 925. The write data is sequentially input into the data input/output pad DQ, is transferred to an input buffer and a flipflop of the data input/output unit 926, and is converted into parallel data by a serial-to-parallel conversion unit. The parallel data is transferred to a data input/output driving unit/sense amplification unit through a write data alignment unit that adjusts the parallel data to be aligned in a line in the memory cell array 925. Data is read from the memory cell array 925, is output as parallel read data through the data input/output driving unit/sense amplification unit, is adjusted by a read data alignment unit or a FiFo unit, is converted into serial data through a parallel-to-serial conversion unit, and is sequentially output to a data input/output line 927 through an output buffer.

The first memory layer 92 includes the chip select matching unit 922, an address decoder 924, a memory cell array 925, and a data input/output unit 926. The second memory layer 94 may be configured in the same manner as the first memory layer 92.

A chip select matching unit 942 of the second memory layer 94 receives the first chip select control signal CS0D and the second chip select control signal CS1_ADDR by using the TSVs 935t and 936t. The chip select matching unit 942 receives the first chip select control signal CS0D in a signal line 922c connected by using the first TSV 935t and the second chip select control signal CS1_ADDR in a signal line 922d connected by using the second TSV 936t. The chip select matching unit 942 generates the ME chip select signal CS_ME in response to the chip select signal CID, the first chip select control signal CS0D, and the second chip select control signal CS1_ADDR.

A data input/output unit 926b of the second memory layer 94 drives write data and read data to and from a memory cell array of the second memory layer 94. The data input/output line 927 connected to the data input/output unit 926 of the first memory layer 92 is electrically connected to a data input/output line 927b connected to the data input/output unit 926b of the second memory layer 94 and a data input/output line 927a connected to the master data input/output unit 939 of the interface layer 93 through a TSV 927t.

Figure 11:
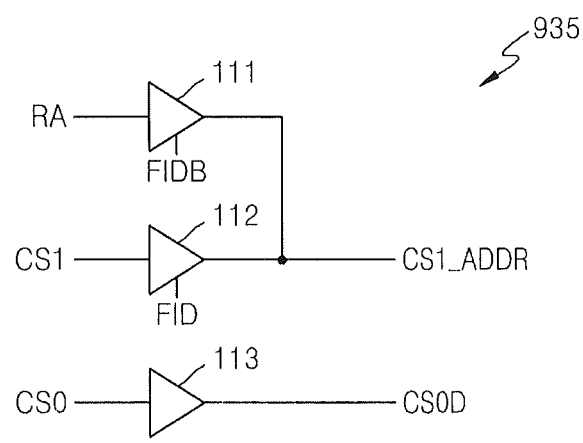
FIG. 11 is a circuit diagram of a chip select MUX unit of FIG. 10.

FIG. 11 is a circuit diagram of the chip select MUX unit 935 of FIG. 10.

Referring to FIG. 11, the chip select MUX unit 935 generates the first chip select control signal CS0D and the second chip select control signal CS1_ADDR according to the address signal RA, the first chip select signal CS0, and the second chip select signal CS1 that are transferred from the buffer unit 931 (of FIG. 10) in response to the complementary mode signal FIDB and the mode signal FID.

The chip select MUX unit 935 includes a first buffer 111 that inputs the address signal RA and outputs the second chip select control signal CS1_ADDR in response to the complementary mode signal FIDB, a second buffer 112 that inputs the address signal RA and outputs the second chip select control signal CS1_ADDR in response to the mode signal FID, and a third buffer 113 that inputs the first chip select signal CS0 and outputs the first chip select control signal CS0D.

The chip select MUX unit 935 generates the second chip select control signal CS1_ADDR by the address signal RA when the complementary mode signal FIDB is activated, and generates the second chip select control signal CS1_ADDR by the second chip select signal CS1 when the mode signal FID is activated. The chip select MUX unit 935 transfers the first chip select control signal CS0D and the second chip select control signal CS1_ADDR to the chip select matching unit 922 of the first memory chip 92 and the second memory chip 94.

Figure 12:
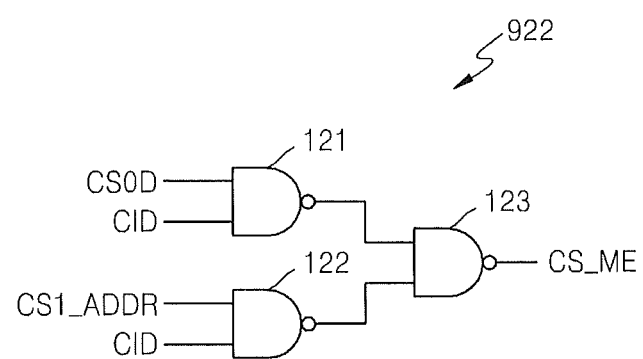
FIG. 12 is a circuit diagram of a chip select matching unit of FIG. 10.

FIG. 12 is a circuit diagram of the chip select matching unit 922 of FIG. 10.

Referring to FIG. 12, the chip select matching unit 922 generates the ME chip select signal CS_ME in response to the chip select signal CID, the first chip select control signal CS0D, and the second chip select control signal CS1_ADDR. The chip select matching unit 922 includes a first NAND gate 121 that inputs the chip select signal CID and the first chip select control signal CS0D, a second NAND gate 122 that inputs the chip select signal CID and the second chip select control signal CS1_ADDR, and a third NAND gate 123 that inputs an output of the first NAND gate 121 and an output of the second NAND gate 122 and outputs the ME chip select signal CS_ME. The chip select signal CID is used to identify the first memory chip 92 or the second memory chip 94. The ME chip select signal CS_ME is used to determine whether a ME memory layer or other memory layer is selected.

When the chip select signal CID that identifies the first memory chip 92 is activated, the chip select matching unit 922 of the first memory chip 92 activates the ME chip select signal CS_ME. In this regard, the chip select matching unit 922 of the second memory chip 94 inactivates the ME chip select signal CS_ME.

When the chip select signal CID that identifies the second memory chip 94 is activated, the chip select matching unit 922 of the second memory chip 94 activates the ME chip select signal CS_ME. In this regard, the chip select matching unit 922 of the first memory chip 92 inactivates the ME chip select signal CS_ME.

Figure 13:
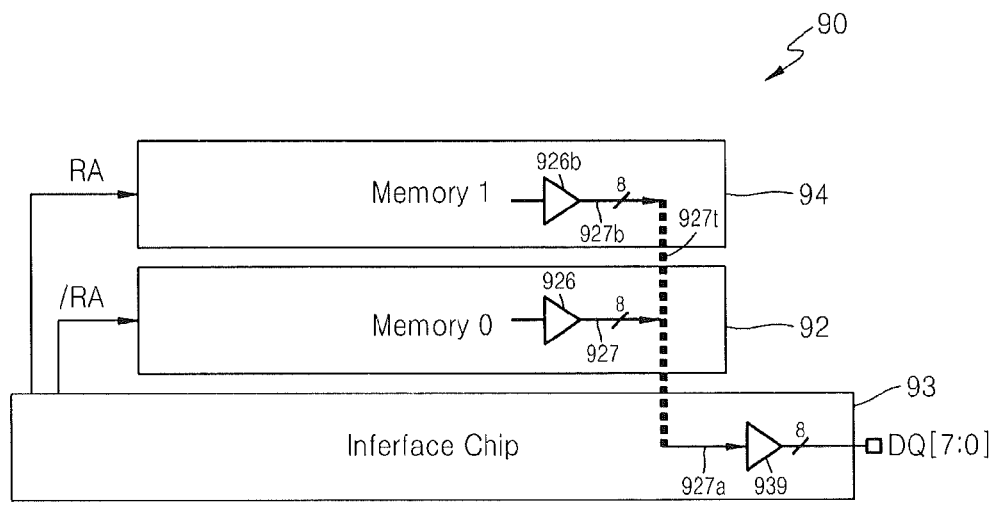
FIGS. 13 through 15 are cross-sectional views of data output structures of a memory device of FIG. 10.
Figure 14:
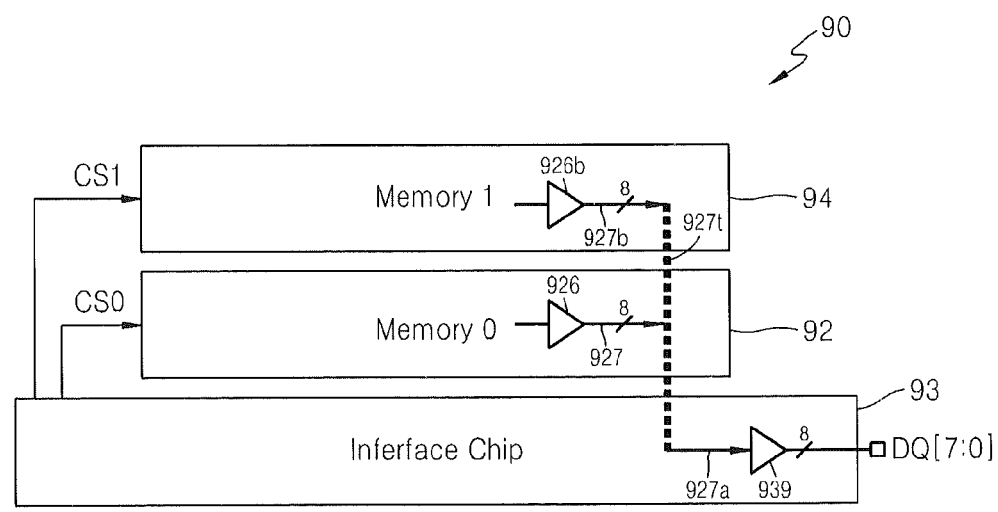
Figure 15:
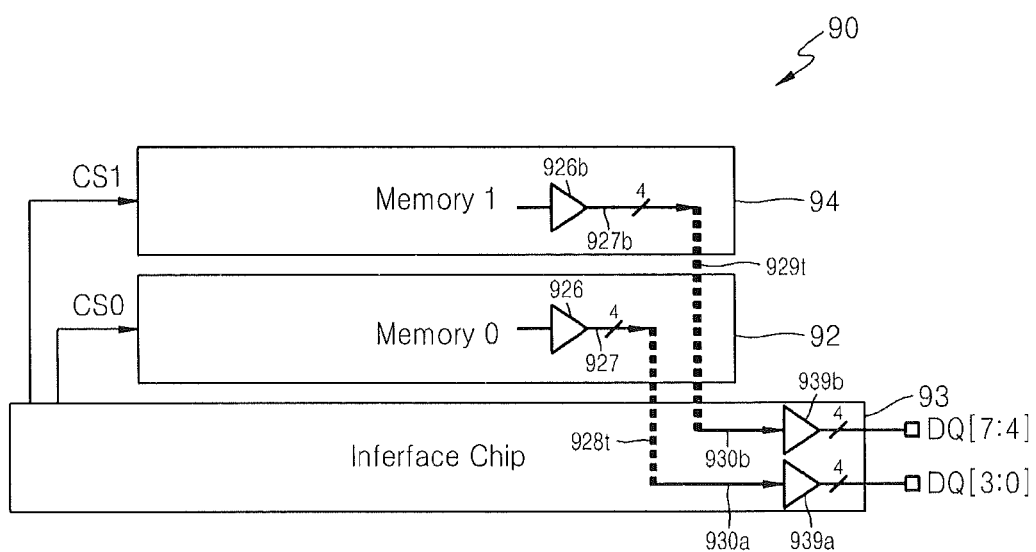

FIGS. 13 through 15 are cross-sectional views of data output structures of the memory device 90 of FIG. 10.

FIG. 13 illustrates a single channel structure when the memory device 90 operates as a mono-rank. FIG. 14 illustrates a single channel structure when the memory device 90 operates as a dual-ranks. FIG. 15 illustrates a threaded channel structure when the memory device 90 operates as a dual rank. In the single channel structure, data is output through a single channel in response to an address signal input along with an active command provided from a memory controller. In the threaded channel structure, data is output through dual channels according to a plurality of active commands provided from the memory controller.

Referring to FIG. 13, the first memory chip 92 and the second memory chip 94 output data to the data input/output units 926 and 926b in response to the first chip select control signal CS0D and the second chip select control signal CS1_ADDR that are actually provided from the interface layer 93. As described in the chip select MUX unit 935 of FIG. 11, the first chip select control signal CS0D and the second chip select control signal CS1_ADDR may be provided from the interface layer 93 by the first chip select signal CS0 and the address signal RA. For conceptual description, the first memory chip 92 and the second memory chip 94 output the data to the data input/output units 926 and 926b in response to the first chip select signal CS0 and the address signal RA.

The first memory chip 92 outputs the data to the data input/output unit 926 in response to the complementary address signal /RA. The data input/output unit 926 of the first memory chip 92 is connected to the data input/output line 927. The second memory chip 94 outputs the data to the data input/output unit 926b in response to the address signal RA. The data input/output unit 926b of the second memory chip 94 is connected to the data input/output line 927b.

The data input/output line 927 of the first memory chip 92 is electrically connected to the data input/output line 927b of the second memory layer 94 and the data input/output line 927a connected to the master data input/output unit 939 of the interface layer 93 by using the TSV 927t. The data input/output lines 927a and 927b of the first memory layer 92 and the second memory layer 94 may be configured as, for example, 8 bits.

The first memory layer 92 that is selected in response to the activation of the complementary address signal /RA outputs 8 bit data to the data input/output pad DQ[7:0]. The second memory layer 94 that is selected in response to the activation of the address signal RA outputs 8 bit data to the data input/output pad DQ[7:0]. That is, the memory device 90 operates as the mono-rank.

An operation timing diagram of the memory device 90 when the memory device 90 operates as the mono-rank is the same as that described with reference to FIG. 4B.

FIG. 14 illustrates the single channel structure when the memory device 90 operates as a dual rank.

Referring to FIG. 14, the first memory chip 92 and the second memory chip 94 output data to the data input/output units 926 and 926b in response to the first chip select control signal CS0D and the second chip select control signal CS1_ADDR that are actually provided from the interface layer 93. As described in the chip select MUX unit 935 of FIG. 11, the first chip select control signal CS0D and the second chip select control signal CS1_ADDR may be provided from the interface layer 93 by the first chip select signal CS0 and the second chip select signal CS1. For conceptual description, the first memory chip 92 and the second memory chip 94 output the data to the data input/output units 926 and 926b in response to the first chip select signal CS0 and the second chip select signal CS1.

The first memory chip 92 outputs the data to the data input/output unit 926 in response to the first chip select signal CS0. The data input/output unit 926 of the first memory chip 92 is connected to the data input/output line 927. The second memory chip 94 outputs the data to the data input/output unit 926b in response to the second chip select signal CS1. The data input/output unit 926b of the second memory chip 94 is connected to the data input/output line 927b.

The data input/output line 927 of the first memory chip 92 is electrically connected to the data input/output line 927b of the second memory layer 94 and the data input/output line 927a connected to the master data input/output unit 939 of the interface layer 93 by using the TSV 927t. The data input/output lines 927a and 927b of the first memory layer 92 and the second memory layer 94 may be configured as, for example, 8 bits.

The first memory layer 92 that is selected in response to the activation of the first chip select signal CS0 outputs 8 bit data to the data input/output pad DQ[7:0]. The second memory layer 94 that is selected in response to the activation of the second chip select signal CS1 outputs 8 bit data to the data input/output pad DQ[7:0]. That is, the memory device 90 operates as a dual rank.

An operation timing diagram of the memory device 90 when the memory device 90 operates as a dual rank is the same as that described with reference to FIG. 5B.

FIG. 15 illustrates the threaded channel structure when the memory device 90 operates as a dual rank.

Referring to FIG. 15, the interface layer 93 includes first and second master data input/output units 939a and 939b for interfacing with the outside of the memory device 90. The first master data input/output unit 939a is connected to the first data input/output pad DQ[3:0]. The second master data input/output unit 939b is connected to the second data input/output pad DQ[7:4].

The first memory chip 92 outputs data to the data input/output unit 926 in response to the first chip select signal CS0. The data input/output unit 926 of the first memory chip 92 is connected to the data input/output line 927. The second memory chip 94 outputs the data to the data input/output unit 926b in response to the second chip select signal CS1. The data input/output unit 926b of the second memory chip 94 is connected to the data input/output line 927b.

The data input/output line 927 of the first memory chip 92 is electrically connected to a data input/output line 930a connected to the first master data input/output unit 939a of the interface layer 93 through a TSV 928t. The data input/output line 927b of the second memory chip 94 is electrically connected to a data input/output line 930b connected to the second master data input/output unit 939b of the interface layer 93 through a TSV 929t.

The first memory layer 92 that is selected in response to the activation of the first chip select signal CS0 outputs 4 bit data to the first data input/output pad DQ[3:0]. The second memory layer 94 that is selected in response to the activation of the second chip select signal CS1 outputs 4 bit data to the second data input/output pad DQ[7:4]. That is, the memory device 90 includes dual-channels including a first path to the first data input/output pad DQ[3:0] and a second path to the second data input/output pad DQ[7:4], and operates as a dual rank.

An operation timing diagram of the memory device 90 when the memory device 90 operates as a dual rank is the same as that described with reference to FIG. 6B.

Figure 16:
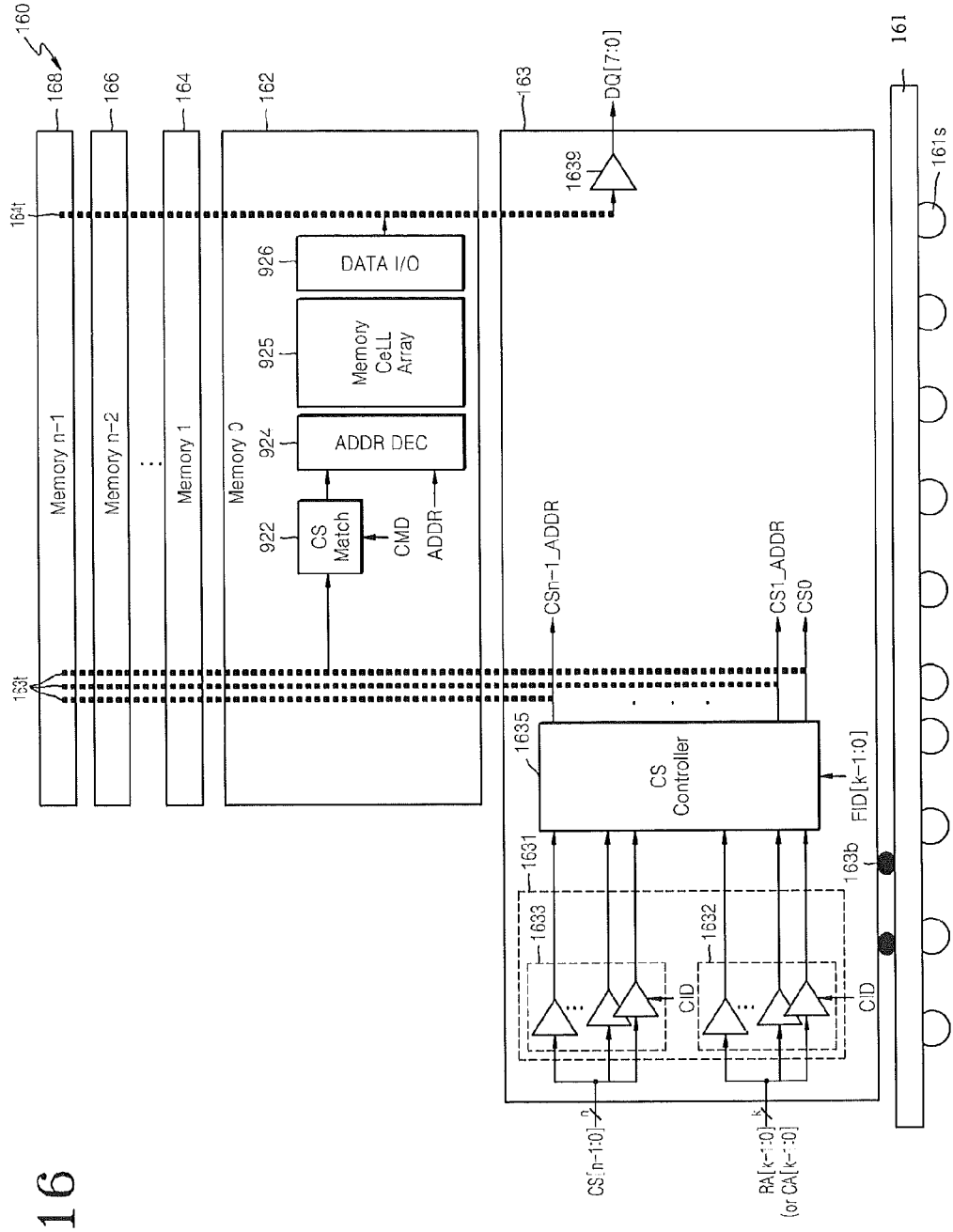
FIG. 16 is a block diagram of a memory device compatible with a mono-rank or multi-ranks, according to some embodiments of the inventive concept.

FIG. 16 is a block diagram of a memory device 160 compatible with a mono-rank or multi-ranks, according to other embodiments of the inventive concept.

Referring to FIG. 16, the memory device 160 is packaged by stacking an interface layer 163 and a plurality of memory layers 162, 164, ... 166, and 168 on a PCB 161. Solder balls 161s that are external terminals are disposed in a rear surface of the PCB 161. The solder balls 161s are connected to address signals RA[k−1:0], CA[k−1:0], chip select signals CS[n−1:0], the clock signal CK, the clock enable signal CKE, the row address strobe signal RAS, the column address strobe signal CAS, the write enable signal WE, the power voltage VDD, and the ground signal VSS. These command and address signals may be provided from a memory controller, and may be electrically connected to the interface layer 163 by using bumps 163b.

N (n is a natural number) memory layers 162, 164, ... 166, and 168 may be stacked in the present embodiment. The memory device 160 has a stack structure in which the interface layer 163 and the n memory layers 162, 164, ... 166, and 168 are connected to each other by using TSVs 163t and micro bumps (not shown).

Although the memory device 160 has the stack structure in which the interface layer 163 and the n memory layers 162, 164, ... 166, and 168 are connected to each other by using TSVs 163t and micro bumps in the present embodiment, the inventive concept is not limited thereto, and the memory device 160 may have a stack structure in which the interface layer 163 and the n memory layers 162, 164, ... 166, and 168 are connected to each other by using a wire bonding, interpose, or a tape including wires. Further, the interface layer 163 and the n memory layers 162, 164, ... 166, and 168 are connected to each other by using a radiative method that uses a RF or ultrasound, an inductive coupling method that uses magnetic induction, or a non-radiative method that uses magnetic field resonance.

The interface layer 163 includes a buffer unit 1631, a chip select MUX unit 1635, and a master data input/output unit 1639. The interface layer 163 may be connected to command and address signals that are provided from a memory controller.

The buffer unit 1631 may be differently configured according to the number of stacked memory layers. The buffer unit 1631 receives the address signals RA[k−1:0] or the address signals CA[k−1:0] and the chip select signals CS[n−1:0] in response to the chip identification signal CID. The chip identification signal CID identifies one of the n memory layers 162, 164, ... 166, and 168. The chip identification signal CID is provided by a fuse box (not shown) disposed in the interface layer 163. The fuse box includes a plurality of fuses. The chip identification signal CID is set by combinations of the selectively cut fuses included in the fuse box.

The address signals RA[k−1:0] or the address signals CA[k−1:0] and the chip select signals CS[n−1:0] may be provided by the memory controller. The address signals RA[k−1:0] may be row address signals that address word lines of a memory cell array 925. In particular, the address signals RA[k−1:0] may be set as k bit MSB among address signals that address banks of the memory cell array 925. The memory controller may provide the column address signals CA[k−1:0] instead of the row address signals RA[k−1:0]. The column address signals CA[k−1:0] address bit lines of the memory cell array 925. Each of the chip select signals CS[n−1:0] may be set as a signal that selects each of the n memory layers 162, 164, ... 166, and 168.

The buffer unit 1631 includes first buffers 1632 that receive the address signals RA[k−1:0] and second buffers 1633 that receive the chip select signals CS[n−1:0] in response to the chip select signal CID. The address signals RA[k−1:0] and the chip select signals CS[n−1:0] are transmitted to the chip select MUX unit 1635.

The chip select MUX unit 1635 generates a plurality of chip select control signals CS0D, CS1_ADDR, ..., CSn−1_ADDR according to the address signals RA[k−1:0] and the chip select signals CS[n−1:0] that are transferred from the buffer unit 1631 in response to a plurality of mode signals FID[k−1:0] that determine a mono-rank mode or a multi-ranks mode. The mode signals FID[k−1:0] may be provided by a fuse box (not shown) disposed in the interface layer 163. The fuse box includes a plurality of fuses. The mode signals FID[k−1:0] are set by combinations of the selectively cut fuses included in the fuse box. The mode signals FID[k−1:0] may be also set according to bit information stored in a storage unit such as the mode register MRS.

The chip select control signals CS0D, CS1_ADDR, ..., CSn−1_ADDR of the chip select MUX unit 1635 determine whether the n memory layers 162, 164, ... 166, and 168 operate as a mono-rank or as multi-ranks. The chip select control signals CS0D, CS1_ADDR, ..., CSn−1_ADDR are electrically connected to the chip select matching unit 922 of each of the n memory layers 162, 164, ... 166, and 168 by using the TSVs 163t.

The master data input/output unit 1639 is used to interface with the outside of the memory device 160. The master data input/output unit 1639 is connected to the data input/output pad DQ[7:0], The master data input/output unit 1639 is electrically connected to the data input/output unit 926 of each of the n memory layers 162, 164, ... 166, and 168 by using TSVs 164t.

The n memory layers 162, 164, ... 166, and 168 may have the same elements as those of the first memory layer 92 described with reference to FIG. 10. That is, the n memory layers 162, 164, ... 166, and 168 may include the chip select matching unit 922, the address decoder 924, the memory cell array 925, and a data input/output unit 926.

The n memory layers 162, 164, ... 166, and 168 of the memory device 160 may operate as the mono-rank or the multi-ranks by combinations of the address signals RA[k−1:0] and the chip select signals CS[n−1:0] that are received in the buffer unit 1631 of the interface layer 163.

FIGS. 17A through 17E are cross-sectional views of the memory device 160 compatible with the mono-rank Rank0 or the multi-ranks Ranks 0 through n−3 of FIG. 16.

Figure 17A:
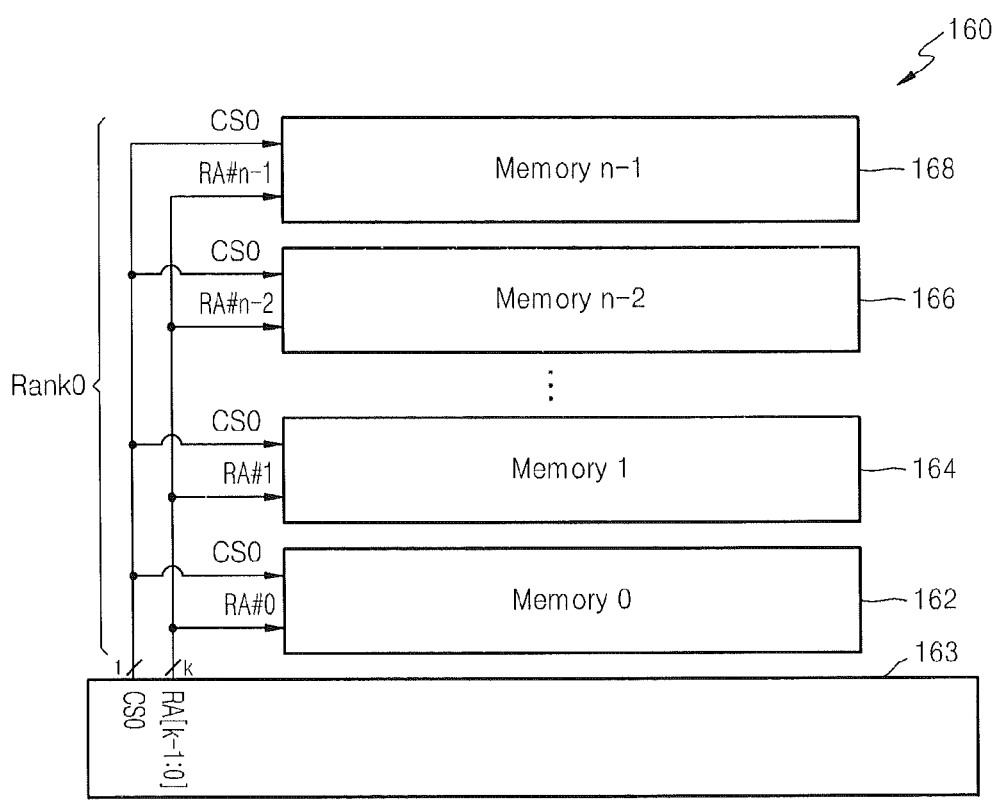
FIGS. 17A through 17E are cross-sectional views of a memory device compatible with a mono-rank or multi-ranks of FIG. 16.

Referring to FIG. 17A, the memory device 160 operates as the mono-rank Rank 0 in which the n memory layers 162, 164, . . . 166, and 168 are selected by the one chip select signal CS0. Each of the n memory layers 162, 164, . . . 166, and 168 is selected by combinations RA#0~RA#n−1 of k (k is a natural number) bit address signals RA[k−1:0].

Figure 17B:
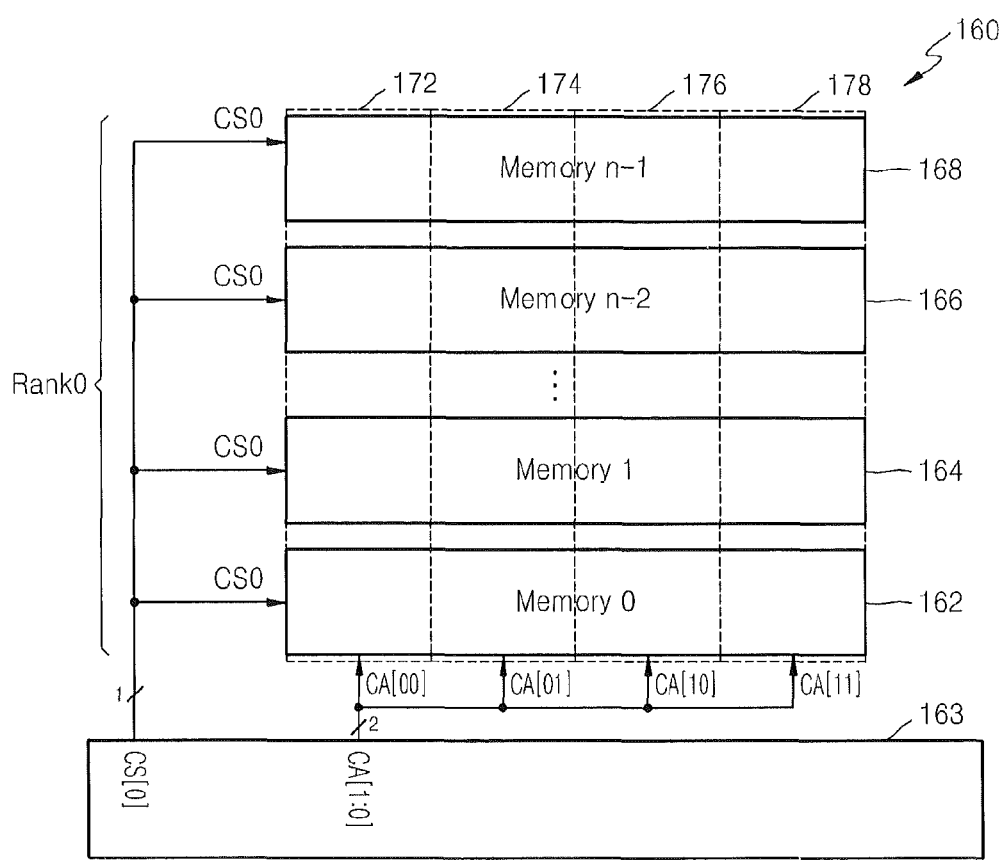

Referring to FIG. 17B, the memory device 160 operates as the mono-rank Rank 0 in which the n memory layers 162, 164, . . . 166, and 168 are selected by the one chip select signal CS0. Each of the n memory layers 162, 164, . . . 166, and 168 is selected by combinations of 2 bit column address signals CA[1:0]. Each of the n memory layers 162, 164, . . . 166, and 168 is divided by bank groups 172, 174, 176, and 178 selected by the combinations of 2 bit column address signals CA[1:0]. The first bank group 172 is accessed by a "00" bit signal of the column address signals CA[1:0], the second bank group 174 is accessed by a "01" bit signal of the column address signals CA[1:0], the third bank group 176 is accessed by a "10" bit signal of the column address signals CA[1:0], and the fourth bank group 178 is accessed by a "11" bit signal of the column address signals CA[1:0].

Figure 17C:
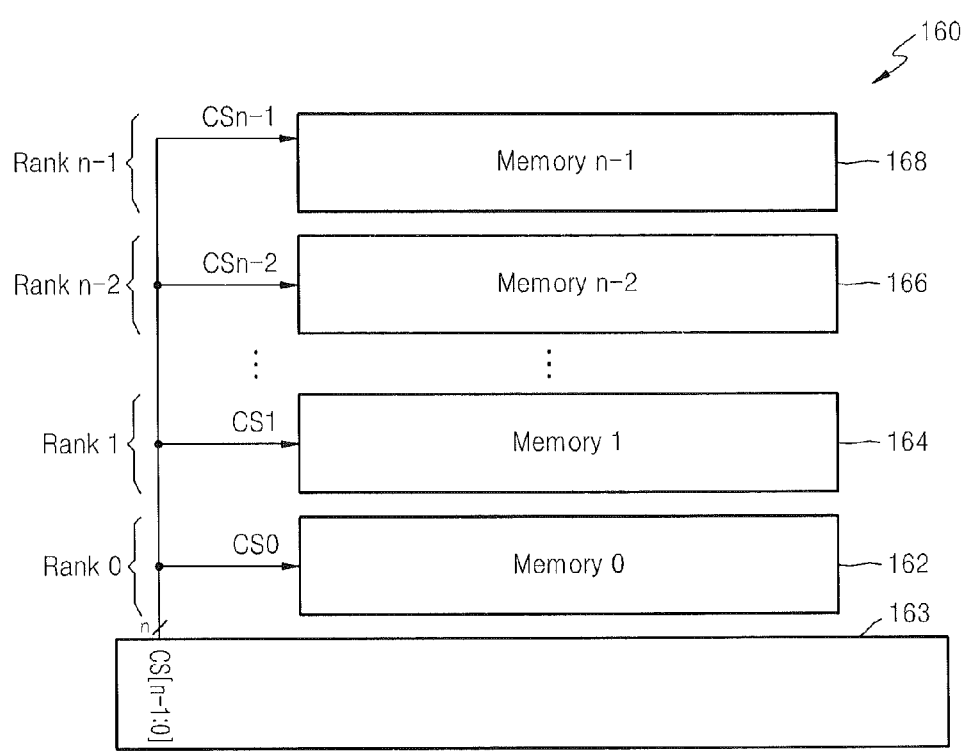

Referring to FIG. 17C, the memory device 160 operates as the multi-ranks Rank0, Rank1, Rankn−2, Rankn−1 in which the n memory layers 162, 164, . . . 166, and 168 are selected by the n chip select signals CS[n−1:0], respectively. The first memory layer 162 operates as the rank Rank0 in which the first memory layer 162 is accessed by the first chip select signal CS0. The second memory layer 164 operates as the rank Rank1 in which the second memory layer 164 is accessed by the second chip select signal CS1. The n−$2^{th}$ memory layer 166 operates as the rank Rankn−2 in which the n−$2^{th}$ memory layer 166 is accessed by a chip select signal CSn−2. The n−$1^{th}$ memory layer 168 operates as the rank Rankn−1 in which the n−$2^{th}$ memory layer 168 is accessed by a chip select signal CSn−1.

Figure 17D:
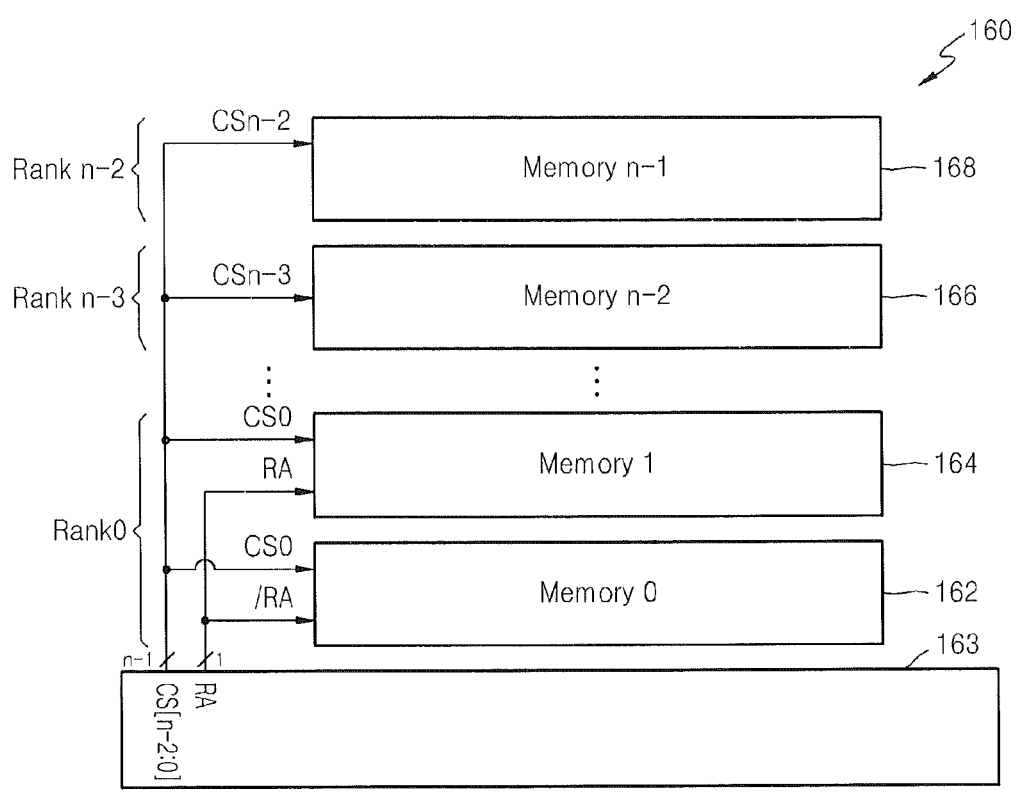

Referring to FIG. 17D, the memory device 160 has a complex memory structure in which the n memory layers 162, 164, . . . 166, and 168 operate as the mono-rank Rank0 and the multi-ranks Ranks 0 through n−3. The first memory layer 162 and the second memory layer 164 operate as the mono-rank, i.e. the rank Rank0, in which the first memory layer 162 and the second memory layer 164 are selected by the first chip select signal CS0 and are selectively accessed by the 1 bit row address signal RA. The other memory layers 166 and 168 operate as the multi-ranks Rankn−3 and Rankn−2 in which the memory layers 166 and 168 are selected by the corresponding chip select signals. The n−$2^{th}$ memory layer 166 operates as the rank Rankn−3 in which the n−$2^{th}$ memory layer 166 is accessed by a chip select signal CSn−3. The n−$1^{th}$ memory layer 168 operates as the rank Rankn−2 in which the n−$2^{th}$ memory layer 168 is accessed by the chip select signal CSn−2, The n memory layers 162, 164, . . . 166, and 168 operate as the multi-ranks Rank0, . . . , Rankn−3, and Rankn−2.

Figure 17E:
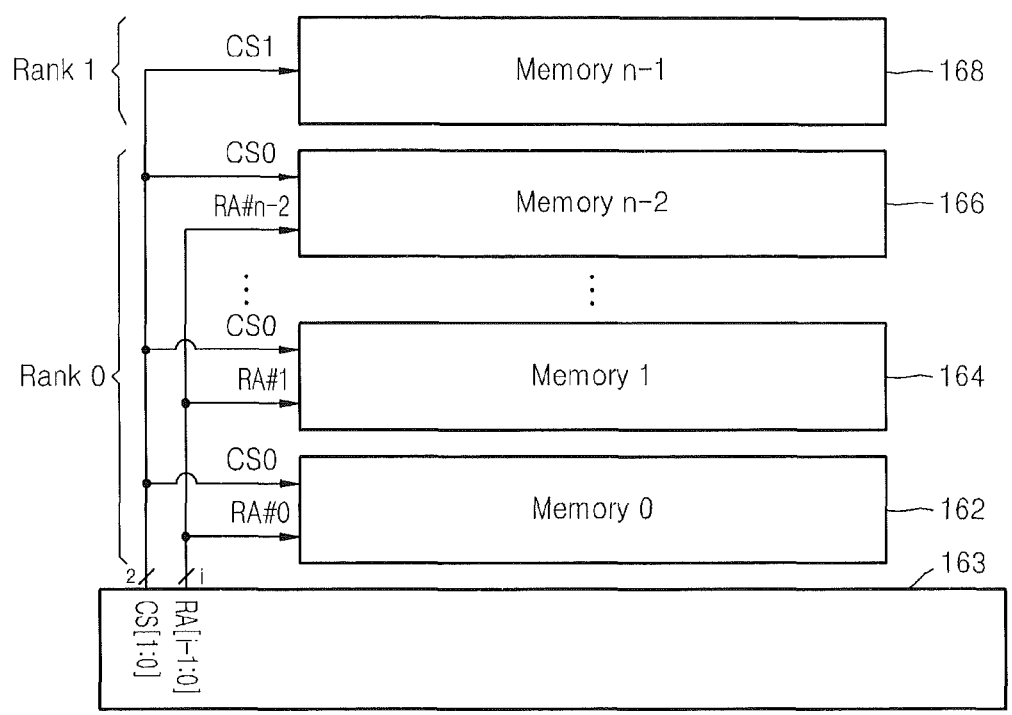

Referring to FIG. 17E, the memory device 160 has another complex memory structure in which the first through n−$2^{th}$ memory layers 162, 164, . . . , 166 operate as the mono-rank, i.e. the rank Rank0, in which the first through n−$2^{th}$ memory layers 162, 164, . . . , 166 are selected by the first chip select signal CS0 and are selectively accessed by the combinations RA#0~RA#n−2 of i bit row address signal RA[i−1:0]. The n−$1^{th}$ memory layer 168 operates as the rank Rank1 in which the n−$1^{th}$ memory layer 168 is accessed by the second chip select signal CS1. The n memory layers 162, 164, . . . 166, and 168 operate as the multi-ranks Ranks0 and Rank1.

Figure 18A:
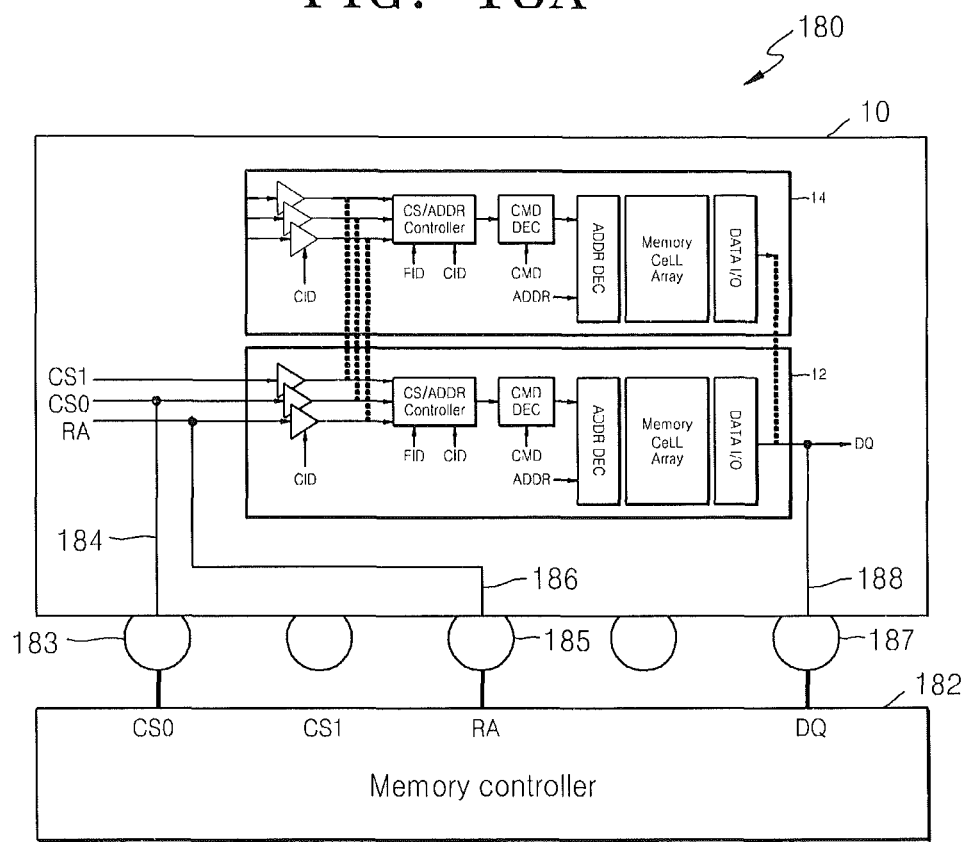
FIGS. 18A and 18B illustrate a memory system including a memory device according to some embodiments of the inventive concept.
Figure 18B:
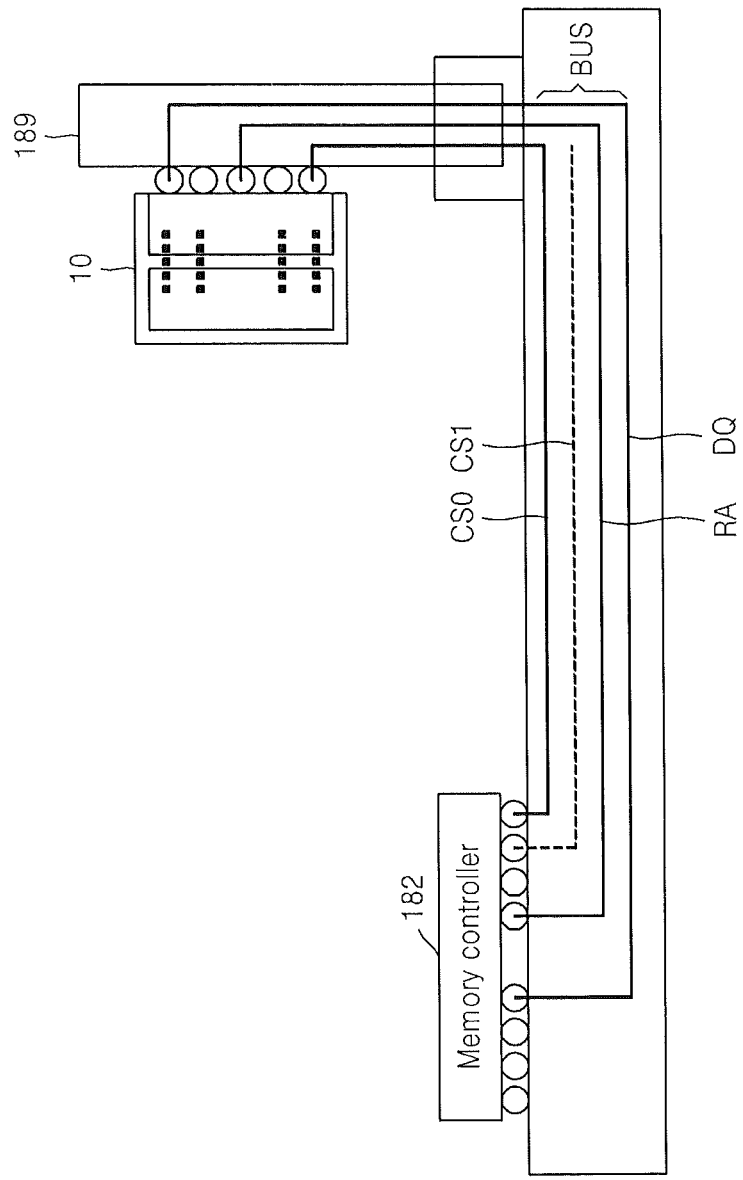

FIGS. 18A and 18B illustrate a memory system 180 including the memory device 10 according to an embodiment of the inventive concept.

Referring to FIG. 18A, the memory system 180 includes the memory device 10 and a memory controller 182 for controlling the memory device 10, The memory device 10 is the same as the memory device 10 that selectively operates as a mono-rank or dual-rank described with reference to FIG. 2. The memory system 180 may use the memory device 90 of FIG. 10 that selectively operates as the mono-rank or dual-rank, instead of the memory device 10 of FIG. 2. The memory system 180 may use the memory device 70 of FIG. 7 or the memory device 160 of FIG. 16 compatible with the mono-rank or multi-ranks, instead of the memory device 10 of FIG. 2.

Although the one memory device 10 is connected to the memory controller 182 in the present embodiment, a plurality of the memory devices 10 may be connected to the memory controller 182.

The memory controller 182 may provide the memory device 10 with a plurality of command signals such as the chip select signals CS0, CS1, the clock signal CK, the clock enable signal CKE, the row address strobe signal RAS, the column address strobe signal CAS, the write enable signal WE, the address signals RA, CA, and data DQ.

When the memory device 10 is requested to operate as a mono-rank, the memory controller 182 provides the memory device 10 with the first chip select signal CS0 and the address signal RA. The first chip select signal CS0 of the memory controller 182 is connected to the first chip select signal CS0 provided to the buffer unit 21 of the first memory layer 12 of the memory device 10 through a solder ball or a bump 183 and a first connection member 184. The address signal RA of the memory controller 182 is connected to the address signal RA provided to the buffer unit 21 of the first memory layer 12 of the memory device 10 through a solder ball or a bump 185 and a second connection member 186. The data DQ of the memory controller 182 is provided to the data input/output pad DQ[7:0] connected to a data input/output unit of the first memory layer 12 of the memory device 10 through a solder ball or a bump 187 and a third connection member 188.

The first and second connection members 184 and 186 of the memory device 10 may use TSVs, wire bonding, interpose, or a tape including wires, a radiative method that uses a RF or ultrasound, an inductive coupling method that uses magnetic induction, or a non-radiative method that uses magnetic field resonance.

Accordingly, the memory device 10 operates as the mono-rank selected by the first chip select signal CS0, and the first memory layer 12 and the second memory layer 14 are selectively accessed by the address signal RA.

Referring to FIG. 18B, the memory controller 182 provides the memory module 189 including the memory device 10 with command signals including the first chip select signal CS0 and the second chip select signal CS1, the address signal RA, and the data DQ through a bus line. The data DQ of the memory controller 182 is connected to the memory device 10 through the bus line. Meanwhile, the second chip select signal CS1 of the memory controller 182 is not connected to the memory device 10.

Figure 19A:
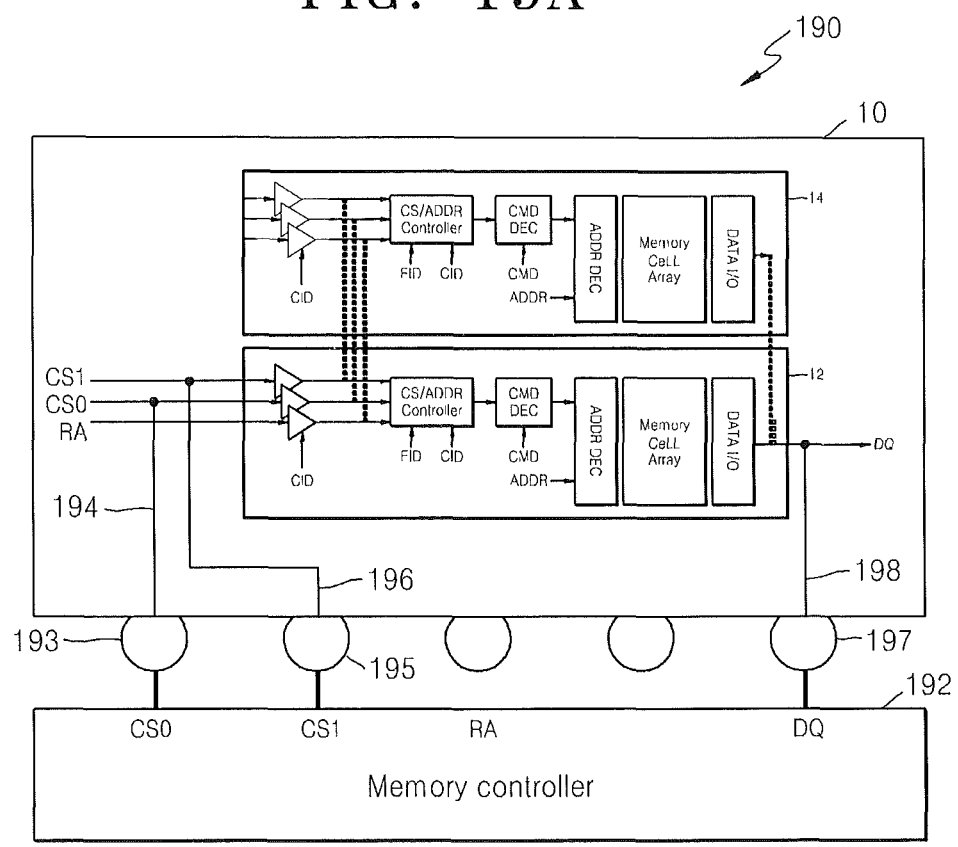
FIGS. 19A and 19B illustrate a memory system including a memory device according to some embodiments of the inventive concept.
Figure 19B:
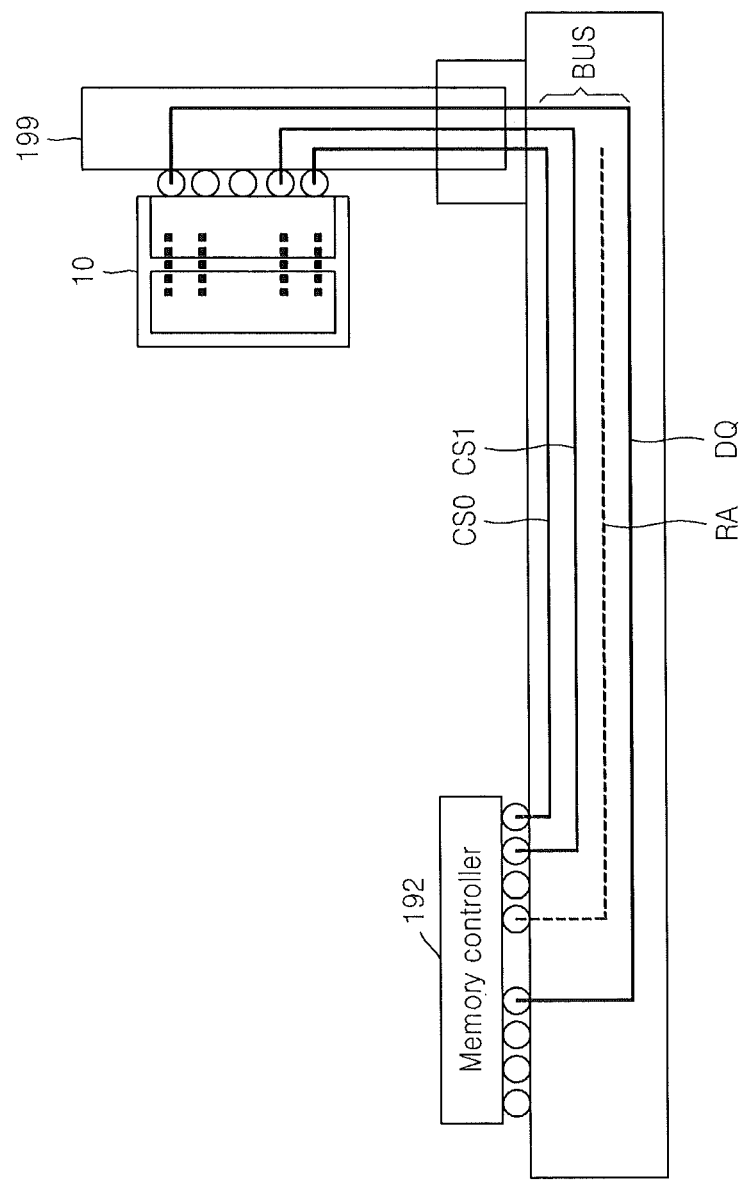

FIGS. 19A and 19B illustrate a memory system 190 including the memory device 10 according to other embodiments of the inventive concept.

Referring to FIG. 19A, the memory system 190 includes the memory device 10 and a memory controller 192 for controlling the memory device 10. The memory device 10 is the same as the memory device 10 that selectively operates as a mono-rank or dual-rank described with reference to FIG. 2. The memory system 190 may use the memory device 90 of FIG. 10 that selectively operates as the mono-rank or dual-rank, instead of the memory device 10 of FIG. 2. The memory system 190 may use the memory device 70 of FIG. 7 or the memory device 160 of FIG. 16 compatible with the mono-rank or multi-rank, instead of the memory device 10 of FIG. 2.

Although the one memory device 10 is connected to the memory controller 192 in the present embodiment, a plurality of the memory devices 10 may be connected to the memory controller 192.

The memory controller 192 may provide the memory device 10 with a plurality of command signals such as the chip select signals CS0, CS1, the clock signal CK, the clock enable signal CKE, the row address strobe signal RAS, the column address strobe signal CAS, the write enable signal WE, the address signals RA, CA, and the data DQ.

When the memory device 10 is requested to operate as a dual rank, the memory controller 192 provides the memory device 10 with the first chip select signal CS0 and the second chip select signal CS1. The first chip select signal CS0 of the memory controller 192 is connected to the first chip select signals CS0 provided to the buffer unit 21 of the first memory layer 12 of the memory device 10 through a solder ball or a bump 193 and a first connection member 194. The second chip select signal CS1 of the memory controller 192 is connected to the second chip select signal CS1 provided to the buffer unit 21 of the first memory layer 12 of the memory device 10 through a solder ball or a bump 195 and a second connection member 196. The data DQ of the memory controller 192 is provided to the data input/output pad DQ[7:0] connected to a data input/output unit of the first memory layer 12 of the memory device 10 through a solder ball or a bump 197 and a third connection member 198.

The first and second connection members 194 and 196 of the memory device 10 may use TSVs, wire bonding, interposer, and/or a tape including wires, a radiative method that uses a RF or ultrasound, an inductive coupling method that uses magnetic induction, and/or a non-radiative method that uses magnetic field resonance.

Accordingly, the memory device 10 operates as a dual rank selected by the two first and second chip select signals CS0 and CS1, and the first memory layer 12 and the second memory layer 14 are selectively accessed by the first and second chip select signals CS0 and CS1.

Referring to FIG. 19B, the memory controller 192 provides the memory module 199 including the memory device 10 with command signals including the first chip select signal CS0 and the second chip select signal CS1, the address signal RA, and the data DQ through a bus line. The first chip select signal CS0 and the second chip select signal CS1 of the memory controller 192 is connected to the memory device 10 through the bus line. The data DQ of the memory controller 192 is connected to the memory device 10 through the bus line. Meanwhile, the address signal RA of the memory controller 182 is not connected to the memory device 10.

Figure 20:
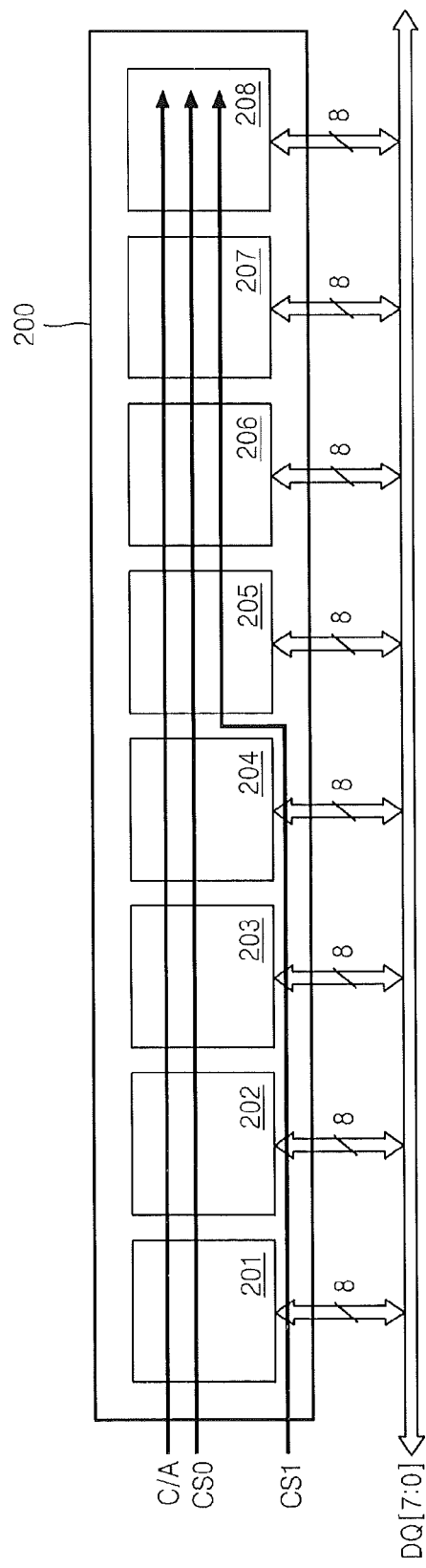
FIG. 20 is a diagram of a general threaded memory module according to some embodiments of the inventive concept.

FIG. 20 is a diagram of a general threaded memory module 200 according to some embodiments of the inventive concept.

Referring to FIG. 20, a plurality of memory devices 201~208 are installed in the threaded memory module 200. For example, the threaded memory module 200 includes the 8 memory devices 201~208. Each of the memory devices 201~208 is connected to a bundle of DQ lines including DQ bus DQ[7:0] (or DQ lanes). A command and address bus C/A is shared by the memory devices 201~208. The first chip select signal CS0 is provided to the memory devices 201~208, and the second chip select signal CS1 is connected to the memory devices 201~208.

In the threaded memory module 200, the memory devices 201204 selected by the first chip select signal CS0 input and output data through the DQ bus DQ[7:0], and the memory devices 205~208 selected by the second chip select signal CS1 input and output data through the DQ bus DQ[7:0].

Figure 21:
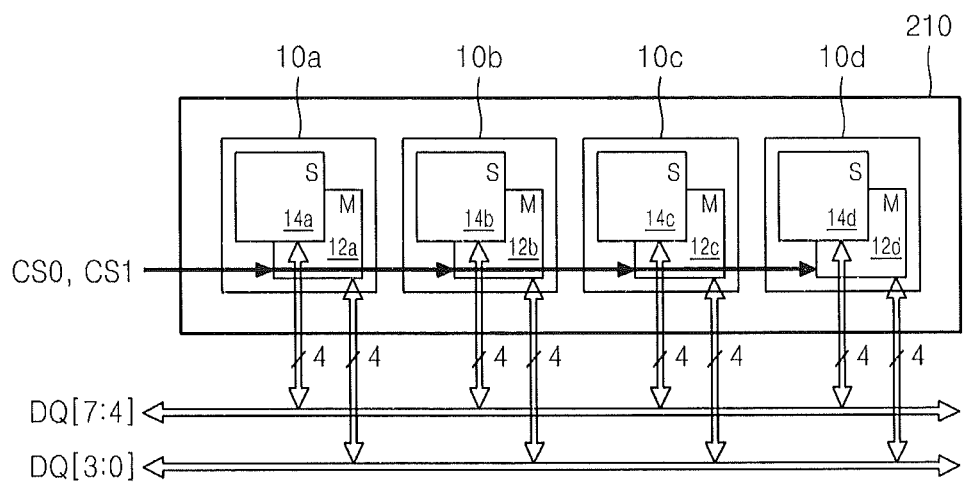
FIG. 21 is a diagram of a memory module including a plurality of memory devices according to some embodiments of the inventive concept.

FIG. 21 is a diagram of a memory module 210 including a plurality of memory devices 10a~10d according to some embodiments of the inventive concept.

Referring to FIG. 21, the plurality of memory devices 10a~10d are installed in the memory module 210. Each of the memory devices 10a~10d is the same as the memory device 10 that selectively operates as a mono-rank or dual-rank described with reference to FIG. 2. Each of the memory devices 10a~10d may includes the threaded channel structure of FIG. 6A. The memory module 210 may use the memory device 90 of FIG. 10 that selectively operates as the mono-rank or dual-rank, instead of the memory device 10 of FIG. 2. The memory module 210 may use the memory device 70 of FIG. 7 or the memory device 160 of FIG. 16 compatible with the mono-rank or multi-rank, instead of the memory device 10 of FIG. 2.

The memory module 210 includes, for example, the four memory devices 10a~10d. Each of the memory devices 10a~10d includes first memory layers 12a~12d and second memory layers 14a~14d. The first memory layers 12a~12d are connected to a first DQ bus DQ[3:0], and the second memory layers 14a~14d are connected to a second DQ bus DQ[7:4]. The first and second chip select signals CS0 and CS1 are provided to the memory devices 10a~10d.

In the memory module 210, the first memory layers 12a~12d selected by the first chip select signal CS0 input and output data through the first DQ bus DQ[3:0], and the second memory layers 14a~14d selected by the second chip select signal CS1 input and output data through the second DQ bus DQ[7:4]. The memory module 210 may have the same function as the threaded memory module 200 of FIG. 20, and reduce a minimum granularity per transfer data size to 32 bits. Accordingly, the memory module 21 may be suitable for a system requiring a small granularity per transfer such as a graphic system.

Figure 22:
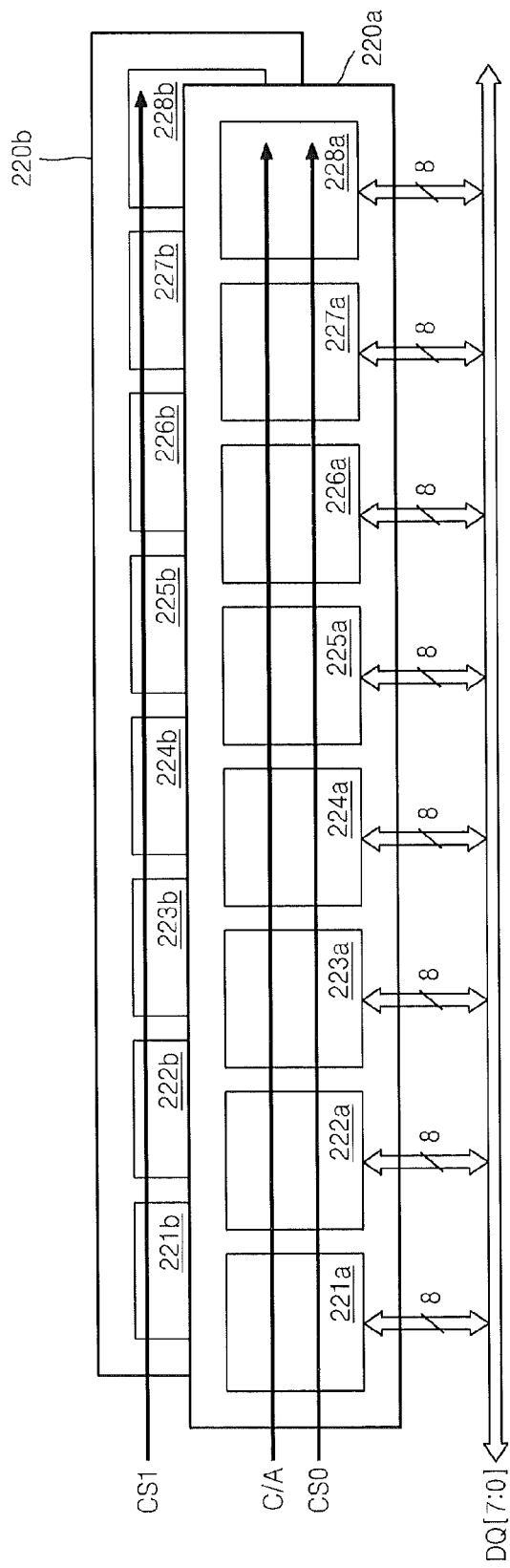
FIG. 22 is a diagram of general dual-rank memory modules according to some embodiments of the inventive concept.

FIG. 22 is a diagram of general dual-rank memory modules 220a and 220b according to some embodiments of the inventive concept.

Referring to FIG. 22, a plurality of memory devices 221a~228a are installed in the first memory module 220a. A plurality of memory devices 221b~228b are installed in the second memory module 220b. For example, the first and second memory modules 220a and 220b include the 8 memory devices 221a~228a and 221b~228b.

Each of the memory devices 221a~228a of the first memory module 220a is connected to the DQ bus DQ[7:0]. Each of the memory devices 221b~228b of the second memory module 220b is connected to the DQ bus DQ[7:0]. The command and address bus C/A is shared by the memory devices 221a~228a and 221b~228b of the first and second memory modules 220a and 220b. The first chip select signal CS0 is provided to the memory devices 221a~228a of the first memory module 220a, and the second chip select signal CS1 is connected to the memory devices 221b~228b of the second memory module 220b.

Each of the memory devices 221a~228a of the first memory module 220a selected by the first chip select signal CS0 input and output data through the DQ bus DQ[7:0], and each of the memory devices 221b~228b of the second memory module 220b selected by the second chip select signal CS1 input and output data through the DQ bus DQ[7:0].

Figure 23:
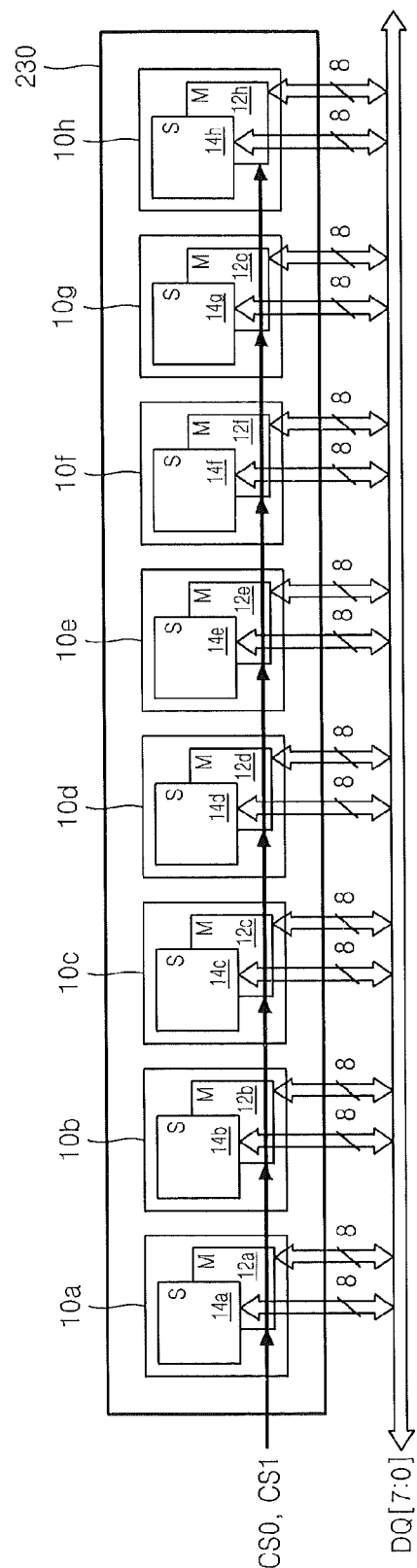
FIG. 23 is a diagram of a memory module including a plurality of memory devices according to some embodiments of the inventive concept.

FIG. 23 is a diagram of a memory module 230 including a plurality of memory devices 10a~10h according to some embodiments of the inventive concept.

Referring to FIG. 23, the plurality of memory devices 10a~10h are installed in the memory module 230. Each of the memory devices 10a~10h is the same as the memory device 10 that selectively operates as a mono-rank or dual-rank described with reference to FIG. 2. Each of the memory devices 10a~10h may includes the threaded channel structure of FIG. 5A. The memory module 230 may use the memory device 90 of FIG. 10 that selectively operates as the mono-rank or dual-rank, instead of the memory device 10 of FIG. 2. The memory module 230 may use the memory device 70 of FIG. 7 or the memory device 160 of FIG. 16 compatible with the mono-rank or multi-rank, instead of the memory device 10 of FIG. 2.

The memory module 230 includes, for example, the 8 memory devices 10a~10h. Each of the memory devices 10a~10h includes first memory layers 12a~12h and second memory layers 14a~14h. The first memory layers 12a~12h are connected to the DQ bus DQ[7:0], and the second memory layers 14a~14h are connected to the DQ bus DQ[7:0]. The first and second chip select signals CS0 and CS1 are provided to the memory devices 10a~10h.

In the memory module 230, the first memory layers 12a~12h selected by the first chip select signal CS0 input and output data through the DQ bus DQ[7:0], and the second memory layers 14a~14h selected by the second chip select signal CS1 input and output data through the DQ bus DQ[7:0]. The memory module 230 may have the same function as the dual-rank memory module 200 of FIG. 22, and reduce a minimum granularity per transfer data size to 32 bits. Accordingly, the memory module 23 has an enhanced data bandwidth without a data bandwidth loss section.

While the inventive concept has been particularly shown and described with reference to exemplary embodiments thereof, it will be understood that various changes in form and details may be made therein without departing from the spirit and scope of the following claims.

What is claimed is:

1. A memory device comprising:
a first memory layer; and
a second memory layer stacked on the first memory layer,
wherein the first memory layer and second memory layer are configured to receive at least one address signal and/or at least one chip select signal, and
wherein the first memory layer and the second memory layer are configured to selectively operate in either a mono-rank mode or in a dual-rank mode responsive to the at least one address signal and/or the at least one chip select signal,
wherein the first memory layer and second memory layer are configured to receive the at least one address signal and/or the at least one chip select signal in response to a chip identification signal and a mode signal, and
wherein the mode signal is provided from a fuse box comprising a plurality of fuses in the first memory layer.

2. The memory device according to claim 1,
wherein the first memory layer and the second memory layer are a same type of memory chips,
wherein each of the first memory layer and the second memory layer comprises:
a core circuit unit in which a memory cell is formed; and
a peripheral circuit unit formed with respect to the memory cell.

3. The memory device according to claim 1,
wherein the first memory layer and the second memory layer are different types of memory chips,
wherein each of the first memory layer and the second memory layer comprises:
a core circuit unit in which a memory cell is formed; and
a peripheral circuit unit formed with respect to the memory cell,
wherein the first memory layer further comprises a master circuit region that is configured to interface with at least one device that is external to the memory device.

4. The memory device according to claim 1,
wherein each of the first memory layer and the second memory layer comprises:
a buffer unit that is configured to receive the at least one address signal and/or the at least one chip select signal in response to a chip identification signal; and
a chip select address control unit that is configured to determine whether the respective one of the first memory layer and/or the second memory layer is selected according to the at least one address signal and/or the at least one chip select signal in response to the chip identification signal and a mode signal, and to generate at least one chip select address control signal used to determine the mono-rank mode or the dual-rank mode.

5. A memory device comprising:
a first memory layer; and
a second memory layer stacked on the first memory layer,
wherein the first memory layer and second memory layer are configured to receive at least one address signal and/or at least one chip select signal, and
wherein the first memory layer and the second memory layer are configured to selectively operate in either a mono-rank mode or in a dual-rank mode responsive to the at least one address signal and/or the at least one chip select signal,
wherein each of the first memory layer and the second memory layer comprises:
a buffer unit that is configured to receive the at least one address signal and/or the at least one chip select signal in response to a chip identification signal; and
a chip select address control unit that is configured to determine whether the respective one of the first memory layer and/or the second memory layer is selected according to the at least one address signal and/or the at least one chip select signal in response to the chip identification signal and a mode signal, and to generate at least one chip select address control signal used to determine the mono-rank mode or the dual-rank mode,
wherein the at least one chip select signal comprises a first chip select signal and a second chip select signal, and
wherein output signal lines of the buffer unit of the first memory layer that receive the at least one address signal, the first chip select signal, and the second chip select signal are electrically connected to signal lines of the at least one address signal, the first chip select signal, and the second chip select signal that are provided to the chip select address control unit of the second memory layer using through silicon vias (TSVs).

6. A memory device comprising:
a first memory layer; and
a second memory layer stacked on the first memory layer,
wherein the first memory layer and second memory layer are configured to receive at least one address signal and/or at least one chip select signal, and
wherein the first memory layer and the second memory layer are configured to selectively operate in either a mono-rank mode or in a dual-rank mode responsive to the at least one address signal and/or the at least one chip select signal,
wherein each of the first memory layer and the second memory layer comprises:
a buffer unit that is configured to receive the at least one address signal and/or the at least one chip select signal in response to a chip identification signal; and
a chip select address control unit that is configured to determine whether the respective one of the first memory layer and/or the second memory layer is selected according to the at least one address signal and/or the at least one chip select signal in response to the chip identification signal and a mode signal, and to generate at least one chip select address control signal used to determine the mono-rank mode or the dual-rank mode wherein the chip select address control unit comprises:
a first logic unit that is configured to generate a first ME chip select address signal according to the first chip select signal, the at least one address signal, and the chip identification signal;
a first buffer that is configured to transfer the first ME chip select address signal to a first node in response to a complementary signal of the mode signal;
a second buffer that is configured to input a signal of the first node and to generate a ME chip select row address control signal;
a second logic unit that is configured to generate a first OTHER chip select address signal according to the first chip select signal, the address signal, and the chip identification signal;
a third buffer that is configured to transfer the first OTHER chip select address signal to a second node in response to the complementary signal of the mode signal;
a fourth buffer that is configured to input a signal of the second node and to generate another chip select row address control signal;
a third logic unit that is configured to generate a second ME chip select address signal according to the first chip select signal, the second chip select signal, and the chip identification signal;
a fifth buffer that is configured to transfer the second ME chip select address signal to the first node in response to the mode signal;
a fourth logic unit that is configured to generate a second OTHER chip select address signal according to the first chip select signal, the second chip select signal, and the chip identification signal; and a sixth buffer that is configured to transfer the second OTHER chip select address signal to the second node in response to the mode signal.

7. The memory device according to claim 6, wherein the chip select address control unit further comprises:
a seventh buffer that is enabled when power is applied to the memory device and that is configured to transfer the second ME chip select address signal;
an eighth buffer that is configured to generate an output of the seventh buffer as a ME chip select column address control signal;
a ninth buffer that is enabled when power is applied to the memory device and that is configured to transfer the second OTHER chip select address signal; and
a tenth buffer that is configured to generate an output of the ninth buffer as another chip select column address control signal.

8. The memory device according to claim 1, wherein a plurality of memory layers are stacked on the second memory layer in such a way that the plurality of memory layers may be selected to operate in either of the mono-rank mode or in a multi-rank mode.

9. The memory device according to claim 1, wherein the mode signal is provided from a mode register.

10. The memory device according to claim 1, wherein the memory device further comprises an interface layer that is configured to receive the at least one address signal or the at least one chip select signal in response to a chip identification signal, and to generate chip select control signals according to the address signal or the chip select signals received in response to the mode signal.

11. The memory device according to claim 5,
wherein the first memory layer and the second memory layer are a same type of memory chips,
wherein each of the first memory layer and the second memory layer comprises:
a core circuit unit in which a memory cell is formed; and
a peripheral circuit unit formed with respect to the memory cell.

12. The memory device according to claim 5,
wherein the first memory layer and the second memory layer are different types of memory chips,
wherein each of the first memory layer and the second memory layer comprises:
a core circuit unit in which a memory cell is formed; and
a peripheral circuit unit formed with respect to the memory cell,
wherein the first memory layer further comprises a master circuit region that is configured to interface with at least one device that is external to the memory device.

13. The memory device according to claim 5, wherein a plurality of memory layers are stacked on the second memory layer in such a way that the plurality of memory layers may be selected to operate in either of the mono-rank mode or in a multi-rank mode.

* * * * *